US010571584B2

United States Patent
Padhi

(10) Patent No.: US 10,571,584 B2
(45) Date of Patent: Feb. 25, 2020

(54) GLOBAL INVERSION BASED ESTIMATION OF ANISOTROPY PARAMETERS FOR ORTHORHOMBIC MEDIA

(71) Applicant: Halliburton Energy Services, Inc., Houston, TX (US)

(72) Inventor: Amit Padhi, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/328,436

(22) PCT Filed: Sep. 18, 2015

(86) PCT No.: PCT/US2015/050995
§ 371 (c)(1),
(2) Date: Jan. 23, 2017

(87) PCT Pub. No.: WO2017/048285
PCT Pub. Date: Mar. 23, 2017

(65) Prior Publication Data
US 2017/0212260 A1 Jul. 27, 2017

(51) Int. Cl.
*G01V 1/30* (2006.01)
*G01V 1/28* (2006.01)
*G06F 17/50* (2006.01)

(52) U.S. Cl.
CPC .............. *G01V 1/305* (2013.01); *G01V 1/282* (2013.01); *G06F 17/5009* (2013.01); *G01V 2210/626* (2013.01); *G01V 2210/671* (2013.01)

(58) Field of Classification Search
CPC ..... G01V 1/305; G01V 1/282; G06F 17/5009
See application file for complete search history.

(56) References Cited

U.S. PATENT DOCUMENTS

2010/0128562 A1* 5/2010 Blias ................... G01V 1/42
367/35
2010/0133010 A1* 6/2010 Blias ................... G01V 1/42
175/50
(Continued)

FOREIGN PATENT DOCUMENTS

CN 102759746 A * 10/2012
WO WO-2014164354 A1 10/2014

OTHER PUBLICATIONS

CN 102759746 A english translation.*
(Continued)

*Primary Examiner* — Christine A Enad

(57) ABSTRACT

Systems and methods for estimating orthorhombic anisotropy parameters of subsurface rock layers are provided. An initial three-dimensional (3D) model of layers in a subsurface formation is generated. Particular combinations of seismic source and receiver locations associated with a vertical seismic profile (VSP) survey of the formation are selected based on a simulation of seismic wave propagation through each layer of the initial 3D model. A global inversion is performed using data points selected from travel time data associated with the VSP survey in order to estimate different sets of anisotropy parameters for the layers of the initial 3D model, where the selected data points correspond to the selected source-receiver combinations. The initial 3D model is refined with an optimal set of anisotropy parameters selected from the estimated parameter sets. The refined 3D model is provided for seismic analysis and well planning operations to be performed for the subsurface formation.

21 Claims, 15 Drawing Sheets

(56) References Cited

U.S. PATENT DOCUMENTS

| | | | |
|---|---|---|---|
| 2010/0312534 A1 | 12/2010 | Xu et al. | |
| 2011/0267921 A1* | 11/2011 | Mortel | G01V 1/28 367/25 |
| 2012/0226442 A1* | 9/2012 | Martin | G01V 1/42 702/6 |
| 2014/0052379 A1 | 2/2014 | McVay et al. | |
| 2016/0162613 A1* | 6/2016 | Shevchenko | G06F 17/5009 703/2 |
| 2017/0205520 A1* | 7/2017 | Moldoveanu | G01V 1/3808 |

OTHER PUBLICATIONS

Korean International Property Office, International Search Report and Written Opinion, dated May 30, 2016, 19 pages, Korea.

Emanouil Blias, Interval VTI and orthorhombic anisotropic parameter estimates from walkaway/3D VSP Data, 2009, 5 pages, SEG Houston 2009 International Exposition and Annual Meeting, Houston, Texas.

Rainer Storn and Kenneth Price, Differential Evolution—A Simple and Efficient Heuristic for Global Optimization over Continuous Spaces, Mar. 20, 1996, 19 pages, Journal of Global Optimization, Netherlands.

Andrey Bakulin and Vladimir Grechka, Short Note: Estimation of anisotropy from multi-azimuth walkaway VSP data in the presence of lateral heterogeneity, 6 pages, England and Colorado.

\* cited by examiner

GLOBAL INVERSION BASED ESTIMATION OF ANISOTROPY PARAMETERS FOR ORTHORHOMBIC MEDIA

CROSS-REFERENCE TO RELATED APPLICATIONS

This application is a U.S. national stage patent application of International Patent Application No. PCT/US2015/050995, filed on Sep. 18, 2015, the benefit of which is claimed and the disclosure of which is incorporated herein by reference in its entirety.

FIELD OF THE DISCLOSURE

The present disclosure relates generally to seismic imaging of subsurface rock formations, and particularly, to seismic imaging of subsurface rock formations based on estimated anisotropic velocity properties of the subsurface formations.

BACKGROUND

Knowing the properties and locations of underground rock formations is useful for making decisions as to where and how to economically produce hydrocarbons from underground reservoirs. In the field of hydrocarbon exploration and production, seismic imaging techniques may be used to gain an understanding of the depth and structures of subsurface geological formations. Various seismic sources, such as dynamite, "thumper" trucks, air guns, and other noise sources located at the surface of a hydrocarbon bearing field, may be used to propagate seismic waves through an underground formation. The propagated waves are reflected through the formation and acquired using various seismic signal receiver devices, for example, geophones, hydrophones, and the like. Seismic-data traces including a record of the sound wave reflections acquired from the underground formation may be used to generate three-dimensional images of subsurface geological structures, including faults and other stratigraphic features that trap hydrocarbon and mineral deposits.

Seismic imaging becomes more complex when the subsurface formation has fractures, a preferred orientation of grains, tectonic stress regimes or other geo-mechanical variations. In such cases, the subsurface medium of the formation layer being imaged may exhibit seismically anisotropic characteristics. Such anisotropy may be effectively modeled with orthorhombic media parameters, which provide greater degrees of freedom relative to other higher symmetries of anisotropy. Orthorhombic media parameters may be used to produce more accurate images of subsurface structures at varying depths within the formation. However, the increased number of parameters per layer adds to the complexity of the inverse problem that is generally used to extract such parameters from observed seismic data. Additionally, such parameter extraction becomes even further complicated in cases where the subsurface is composed of non-horizontal or non-flat layers.

DESCRIPTION OF ILLUSTRATIVE EMBODIMENTS

Figure 1A:
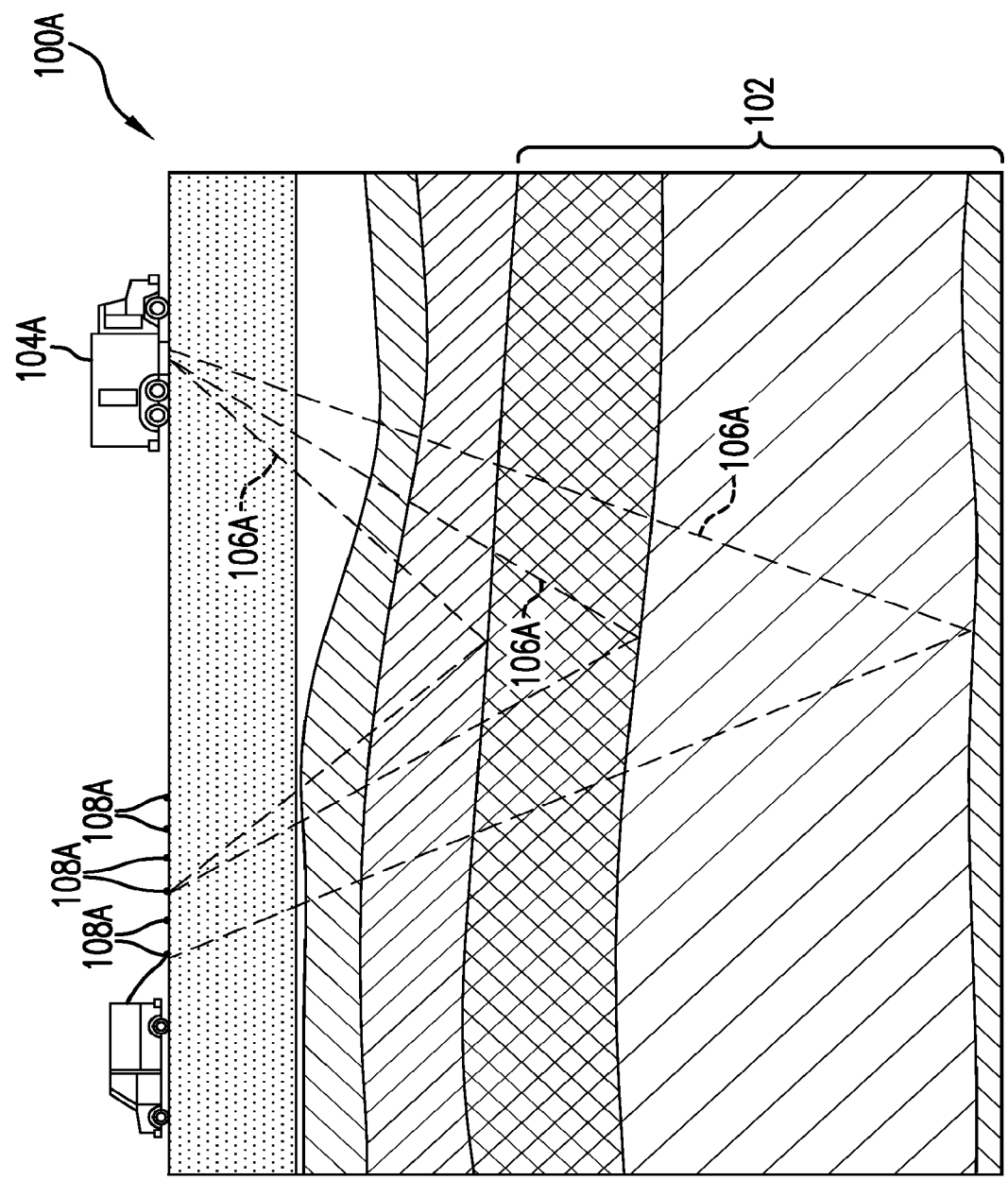
FIG. 1A is a side elevation view of a surface seismic survey system for a subsurface formation in accordance with one or more embodiments.

Embodiments of the present disclosure relate to estimating anisotropy parameters of orthorhombic subsurface formation layers for improved seismic modeling and analysis of three-dimensional (3D) subsurface structures. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. It would also be apparent to one skilled in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

The disclosure may repeat reference numerals and/or letters in the various examples or Figures. This repetition is for the purpose of simplicity and clarity and does not in itself dictate a relationship between the various embodiments and/or configurations discussed. Further, spatially relative terms, such as beneath, below, lower, above, upper, uphole, downhole, upstream, downstream, and the like, may be used herein for ease of description to describe one element or feature's relationship to another element(s) or feature(s) as illustrated, the upward direction being toward the top of the corresponding figure and the downward direction being toward the bottom of the corresponding figure, the uphole direction being toward the surface of the wellbore, the downhole direction being toward the toe of the wellbore. Unless otherwise stated, the spatially relative terms are intended to encompass different orientations of the apparatus in use or operation in addition to the orientation depicted in the Figures. For example, if an apparatus in the Figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Moreover, even though a Figure may depict a horizontal wellbore or a vertical wellbore, unless indicated otherwise, it should be understood by those skilled in the art that embodiments of the present disclosure are equally well suited for use in wellbores having other orientations including vertical wellbores, slanted wellbores, multilateral wellbores or the like. Likewise, unless otherwise noted, even though a Figure may depict an offshore operation, it should be understood by those skilled in the art that the apparatus according to the present disclosure is equally well suited for use in onshore operations and vice-versa. Further, unless otherwise noted, even though a Figure may depict a cased hole, it should be understood by those skilled in the art that the apparatus according to the present disclosure is equally well suited for use in open hole operations.

As will be described in further detail below, embodiments of the present disclosure may be used to estimate anisotropy parameters of orthorhombic subsurface media for improved seismic modeling and analysis of 3D layers of a subsurface formation. In one or more embodiments, anisotropic ray tracing (ART) techniques may be combined with a global inversion process to extract orthorhombic media parameters from azimuthally varying travel times observed for seismic wave propagations within 3D non-flat layers of the subsurface formation. The disclosed global inversion process may be used, for example, to minimize any mismatch between measured or observed qP direct wave first arrival travel times and travel times simulated through a 3D model of the subsurface layers using ART. As such, the disclosed techniques allow each modeled formation layer to be described using only six P-wave anisotropy parameters (e.g., $V_{P0}$, $\varepsilon 1$, $\varepsilon 2$, $\delta 1$, $\delta 2$ and $\delta 3$), rather than the full set of nine anisotropy parameters generally used for describing such orthorhombic subsurface systems. In the process of minimizing differences between observed and simulated data, an optimal set of orthorhombic media parameters may be obtained along with an optimized 3D model of the layered orthorhombic media. Such a 3D model may then be used to perform various operations related to seismic modeling and analysis. Such operations may include, but are not limited to, generating improved seismic images of 3D subsurface layers and performing different types of seismic analyses for purposes of well planning and design.

Illustrative embodiments and related methodologies of the present disclosure are described below in reference to FIGS. 1-13 as they might be employed, for example, in a computer system for seismic simulation and modeling of subsurface rock formations. An example of such a computer system will be described below in reference to FIGS. 2 and 14. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

In the examples described below, seismic surveying along with other available geophysical, borehole, and geological data may be used to provide information about the structure and distribution of rock types and properties of different layers of a subsurface formation. Different types of seismic surveying will be described in further detail below with respect to FIGS. 1A and 1B. While the seismic surveys in the following examples are described in the context of land-based seismic surveying, it should be noted that the techniques disclosed herein are not intended to be limited thereto and that these techniques may be applied to seismic surveys performed on land or in water, e.g., as part of an onshore or off-shore drilling operation, respectively. It will be assumed for purposes of the examples described below that the subsurface formation is composed of 3D layered orthorhombic media. Also, it will be assumed in the following examples that fracture orientation and other relevant formation layer characteristics are already known or predetermined using any of various other types of analysis techniques as appropriate or desired for a particular implementation.

FIG. 1A is a side elevation view of a surface seismic survey system 100A for a subsurface formation 102 in accordance with one or more embodiments. Subsurface formation 102 may be, for example, a hydrocarbon bearing formation including a plurality of non-flat orthorhombic media layers. System 100A may be used to conduct a surface seismic survey that provides a seismic mapping of formation 102. System 100A includes a seismic source 104A and an array of seismic receivers 108A. As shown in FIG. 1A, seismic source 104A may be a specialized "thumper" truck that generates seismic energy 106A. However, it should be noted that embodiments are not limited thereto and that seismic source 104A may be implemented using any of various other types of seismic sources including, but not limited to, air guns, dynamite or other types of explosives.

In conducting the surface seismic survey, seismic energy 106A may be shot from source 104A in the form of pulses or waves that propagate to and encounter different layers of formation 102. For each layer encountered, a portion of seismic energy 106A is reflected back towards the earth's face and received by one or more receiver devices in the array of seismic receivers 108A at the surface. Each receiver may be a surface seismic sensor, e.g., a geophone or hydrophone, for detecting waves of seismic energy 106A shot from source 104A and recording arrival times and amplitudes of the detected waves.

The surface seismic survey conducted using system 100A may be, for example, an initial exploratory survey conducted over a relatively large area of earth in order to obtain a low resolution mapping of the geometry of subsurface formation 102. Such a broad-based seismic survey may be used in conjunction with core samples and/or well logs from one or more exploratory wellbores for purposes of hydrocarbon exploration and well planning. From the initial exploratory survey, a determination as to which specific location is likely to contain hydrocarbons may be made. For further exploration and planning purposes, a more detailed vertical seismic profile (VSP) survey of the particular location may be conducted, as will be described in further detail below with respect to FIG. 1B.

Figure 1B:
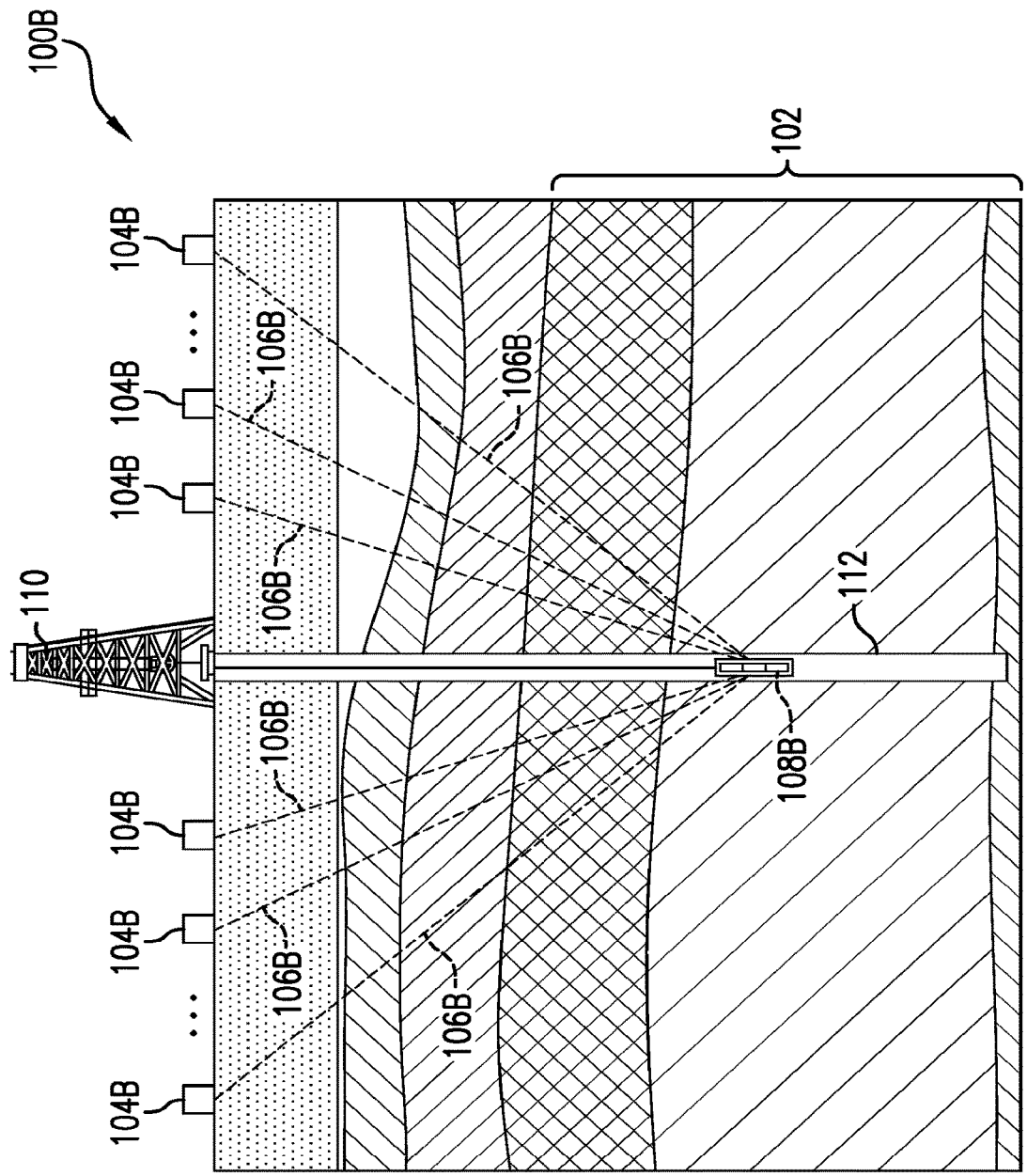
FIG. 1B is a side elevation view of a vertical seismic profile (VSP) survey system for the subsurface formation of FIG. 1A in accordance with one or more embodiments.

FIG. 1B is a side elevation view of a vertical seismic profile (VSP) survey system 100B for subsurface formation 102 of FIG. 1A in accordance with one or more embodiments. As shown in FIG. 1B, a drilling rig 110 at the surface may be used to drill a borehole 112 into different layers of formation 102. A plurality of seismic sources 104B at the surface are used to generate seismic energy 106B that propagates through the different layers of formation 102, as described above. It should be appreciated that any number of sources may be used as desired for a particular implementation. Seismic sources 104B may be implemented using any of various seismic source devices, e.g., dynamite or other explosives, thumper trucks, air guns, or other noise sources. The waves of seismic energy 106B and direct arrival times from sources 104B are detected and recorded by an array of seismic receivers 108B disposed within borehole 112. Seismic receivers 108B may be, for example, an array of downhole seismic sensors, e.g., geophones or hydrophones, coupled to or integrated within a bottom hole assembly of a drill string or wireline logging device disposed within borehole 112.

In one or more embodiments, seismic sources 104B may be located at the surface in a multi-azimuthal arrangement to produce travel time datasets that constrain the orthorhombic anisotropic parameters that may be responsible for any observed azimuthal variations of the seismic wave propagations within the 3D layered subsurface media of formation 102. An analysis of such orthorhombic media parameters may help to explain the geo-mechanical phenomena causing the observed azimuthal variations. As described above and as will be described in further detail below, the disclosed embodiments may employ ART techniques in combination with a global inversion scheme to extract the orthorhombic media parameters from the travel time datasets that are produced from the VSP survey. Such parameters may then be used to generate more accurate images of complex subsurface structures relative to conventional seismic imaging techniques and perform other types of seismic analysis operations for well planning and design purposes.

Figure 2:
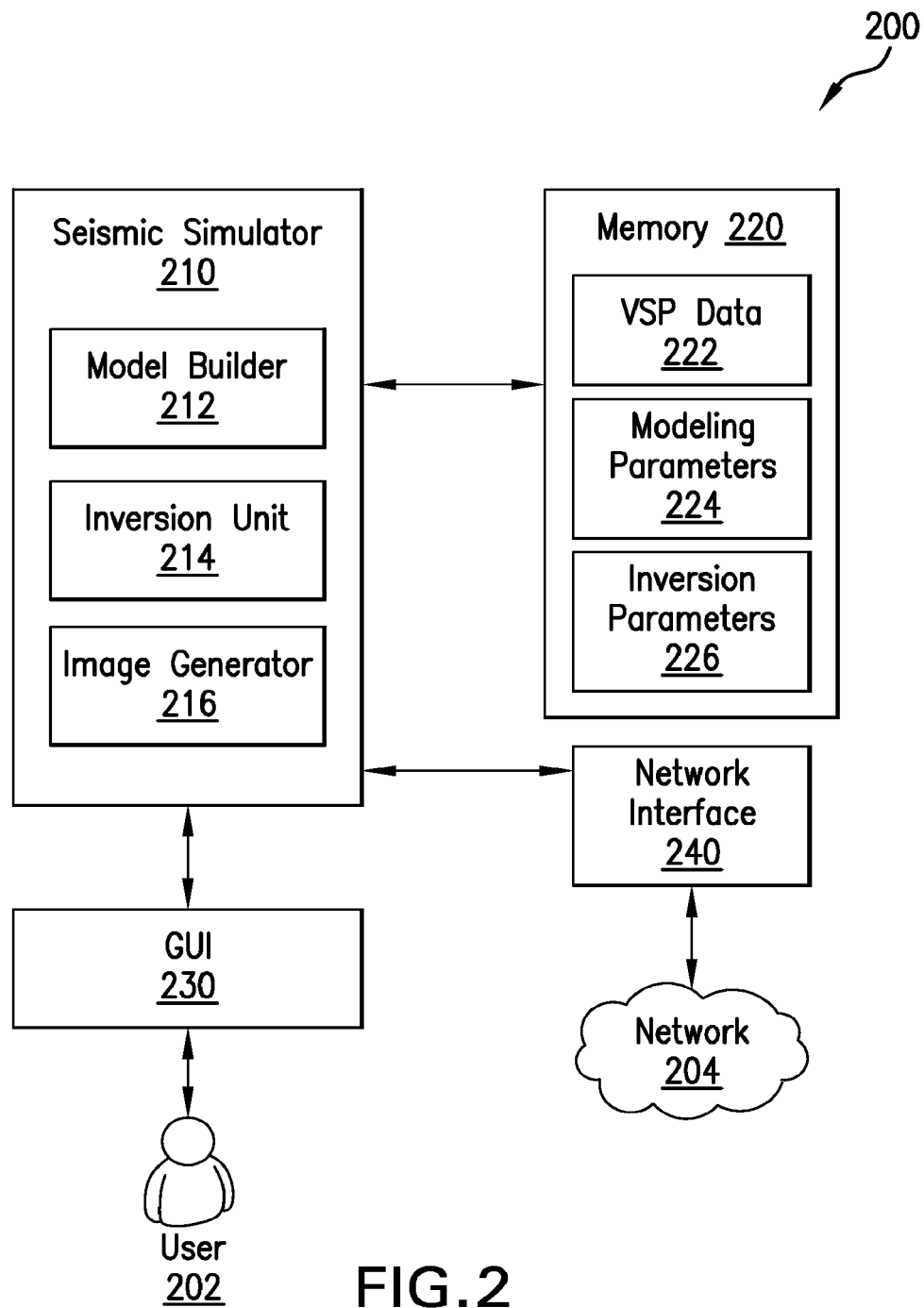
FIG. 2 is a block diagram of a seismic simulation system in accordance with one or more embodiments.

FIG. 2 is a block diagram of a seismic simulation system 200 in accordance with at least some embodiments. As shown in FIG. 2, system 200 includes a seismic simulator 210, a memory 220, a graphical user interface (GUI) 230, and a network interface 240. Simulator 210 includes a model builder 212, an inversion unit 214, and an image generator 216. Memory 220 may be used to store VSP data 222, modeling parameters 224 and inversion parameters 226. In one or more embodiments, simulator 210 and its components (model builder 212, inversion unit 214, and image generator 216), memory 220, GUI 230, and network interface 240 may be communicatively coupled to each other via, for example, an internal bus of system 200.

In one or more embodiments, system 200 can be implemented using any type of computing device having one or more processors, a user input (for example, a mouse, QWERTY keyboard, touch-screen, a graphics tablet, or microphone), and a communications infrastructure capable of receiving and transmitting data over a network. Such a computing device can be, for example and without limitation, a mobile phone, a personal digital assistant (PDA), a tablet computer, a laptop computer, a desktop computer, a workstation, a cluster of computers, a set-top box, or other similar type of device capable of processing instructions and receiving and transmitting data to and from humans and other computing devices. Although only simulator 210, memory 220, GUI 230, and network interface 240 are shown in FIG. 2, it should be appreciated that system 200 may include additional components, modules, and/or sub-components as desired for a particular implementation.

It should also be appreciated that simulator 210 and its components (model builder 212, inversion unit 214, and image generator 216) may be implemented in software, firmware, hardware, or any combination thereof. Furthermore, embodiments of model builder 212, inversion unit 214, and image generator 216, or portions thereof, can be implemented to run on any type of processing device including, but not limited to, a computer, workstation, embedded system, networked device, mobile device, or other type of processor or computer system capable of carrying out the functionality described herein.

Memory 220 can be used to store information accessible by simulator 210 for performing various seismic simulation functions along with the orthorhombic anisotropy parameter estimation and inversion techniques disclosed herein. Such information may include, but is not limited to, VSP data 222, modeling parameters 224 and inversion parameters 226, as shown in FIG. 2. In one or more embodiments, VSP data 222, modeling parameters 224 and inversion parameters 226 may represent different types of inputs for controlling different aspects of the seismic simulation and parameter estimation functions performed by seismic simulator 210, as will be described in further detail below. Memory 220 may be any type of recording medium coupled to an integrated circuit that controls access to the recording medium. The recording medium can be, for example and without limitation, a semiconductor memory, a hard disk, or other similar type of memory or storage device. Moreover, memory 220 may be integrated within system 200 or an external device communicatively coupled to system 200. In some implementations, memory 220 may be a remote cloud-based storage location communicatively coupled to system 200 over a network 204 via network interface 240.

Network 204 can be any type of network or combination of networks used to communicate information between different computing devices. Network 204 can include, but is not limited to, a wired (e.g., Ethernet) or a wireless (e.g., Wi-Fi and 3G) network. In addition, network 204 can include, but is not limited to, a local area network, medium area network, and/or wide area network such as the Internet.

In some implementations, at least a portion of the above-described input data and parameters stored in memory 220 may be based on input received from a user 202. For example, simulator 210 may use GUI 230 to receive input relating to a specified data source or values of one or more input parameters from user 202 via a user input device (not shown), e.g., a mouse, keyboard, microphone, or touch-screen display. GUI 230 may also be used to present information to user 202 based on the received input. The information may be presented to user 202 via a display (not shown) coupled to system 200. The display may be, for example and without limitation, a cathode ray tube (CRT) monitor, a liquid crystal display (LCD), or a touch-screen display, e.g., in the form of a capacitive touch-screen light emitting diode (LED) display. GUI 230 may be provided to user 202 by, for example, a seismic simulation and imaging application executable at system 200.

Model builder 212 may be used to generate an initial 3D model of layers in a subsurface formation. The initial 3D model may be generated based on surface seismic data. Such data may be obtained from a surface seismic survey performed for the subsurface formation, e.g., using surface seismic survey system 100A of FIG. 1A, as described above. The surface seismic data may include, for example, surface seismic depth images that model builder 212 can use to pick general 3D layer interfaces for the generated 3D model. Model builder 212 may also use the surface seismic data along with one or more other data sources, e.g., well log data, to determine initial anisotropy parameters for each of the modeled formation layers. Such initial anisotropy parameters may represent an initial approximation or guess of the actual anisotropy parameters for modeling purposes. These initial parameters may be refined along with the initial 3D model through a global inversion process performed by inversion unit 214, as will be described in further detail below. While not shown in FIG. 2, the surface seismic data and/or other data sources related to the formation may be stored in memory 220 or within a remote data storage device accessible to model builder 212 via network interface 240 and network 204.

In addition to using surface seismic data to generate the initial 3D model, model builder 212 may obtain VSP data 222 from an actual VSP survey conducted for the subsurface formation in this example, e.g., using VSP survey system 100B of FIG. 1B, as described above. VSP data 222 may include measured or observed travel time data for a plurality of seismic source and receiver locations associated with the VSP survey of the subsurface formation. Such travel time data may include, for example, first arrival times of direct qP-wave propagations between different sources and receivers in the VSP survey. Accordingly, VSP data 222 may be stored in memory 220 in the form of a table of different sets of source and receiver locations along with their corresponding first arrival times. However, it should be appreciated that embodiments are not limited to any particular data format and that the location and travel time data for different source-receiver combinations may be stored as a list or using any of various other types of data structure as desired for a particular implementation.

In one or more embodiments, system 200 may communicate with a VSP survey system, e.g., VSP survey system 100B of FIG. 1B, as described above, to initiate the VSP survey of the formation via network interface 240 and network 204. In some implementations, the VSP survey of the formation may be initiated by system 200 based on input received from user 202 via GUI 230. Alternatively, the VSP survey may be initiated based on input received from a remote user of another computer system via network 204 and network interface 240. For example, in response to receiving the appropriate input from user 202 via GUI 230 or remote user's computer system via network interface 240, system 200 may initiate the VSP survey by, for example, sending one or more commands via network 204 to actuate surface seismic source devices of the VSP survey system, e.g., seismic sources 104B of FIG. 1B, as described above. The VSP survey system may send seismic travel time data resulting from the conducted VSP survey to system 200 via network 204. The data received by system 200 from the VSP survey system may then be stored in memory 220 as VSP data 222.

In some implementations, system 200 may communicate directly with the seismic source devices of the VSP survey system to initiate the VSP survey and receive the resulting VSP survey data via network 204 as described above. Alternatively, system 200 may communicate with a central control unit or computing device of the VSP survey system for this purpose. The central control unit of the VSP survey system may be used, for example, to control the seismic sources, detectors and receivers of the system and exchange information to and from system 200 or other remote computer systems via network 204.

In some implementations, VSP data 222 may include "synthetic" travel time data generated based on a simulated VSP survey performed by model builder 212. Such a simulation may be performed based on, for example, commands input by user 202 via GUI 230. User 202 in this example may use the generated synthetic VSP data for purposes of testing or verifying the generated 3D model.

Model builder 212 may perform forward modeling to select an optimal set of source and receiver combinations and corresponding data points from VSP data 222 for the global inversion to be performed by inversion unit 214. The forward modeling may simulate seismic wave propagation through each layer of the initial 3D model. In one or more embodiments, model builder 212 may perform the simulation by using ART to shoot virtual seismic rays between different combinations of the source and receiver locations from VSP data 222. Such two-point ray tracing by model builder 212 may be repeated multiple times for any number of source and receiver combinations to simulate the VSP survey. To optimize this process, modeling parameters 224 in memory 220 may be used to specify a ray direction and other ray parameters for one or more source-receiver combinations. The use of such a ray direction parameter may, for example, enable model builder 212 to exclude other possible directions in which the ray may be shot from a source in order to find a particular receiver. This in turn may enable the computational requirements of the simulation to be reduced and system performance to be improved.

The virtual ray shot by model builder 212 in this example may start from a seismic energy source and refract at each interface of the layered medium according to Snell's law. It should be noted that such a ray generally refracts with its phase velocity and travels in the medium (i.e., through individual formation layers) with its group velocity. It should also be noted that group and phase velocities in an anisotropic medium (including orthorhombic anisotropy), as opposed to an isotropic medium, differ depending on the strength of anisotropy (defined by orthorhombic parameters in this case). Hence, model builder 212 may use ART techniques to compute phase velocities for refraction at each interface. In one or more embodiments, such computation may use Christoffel's equation to determine the vertical slowness component for each subsurface layer as the ray propagates through the formation in accordance with the group velocities of the respective layers. Further, Snell's law may be applied at each layer interface by locally conserving ray parameters of the incident and transmitted rays at each non-planar interface.

The ray shooting by model builder 212 may be part of a forward modeling optimization scheme for finding an optimal ray path connecting each seismic source to a particular receiver. In one or more embodiments, model builder 212 may use the optimization scheme to minimize the distance between the end of a shot ray and the receiver by perturbing and shooting multiple rays until a predetermined or user-specified stopping criterion is satisfied. As the rays are shot, the model builder 212 may output ray paths and associated travel times. However, some of the output ray paths may fail to properly connect a source to the corresponding receiver, e.g., as specified in the table of source-receiver locations and corresponding travel times within VSP data 222. Thus, results of the forward modeling or seismic simulation performed by model builder 212 may reveal that certain combinations of source and receiver locations and their corresponding first arrival times may be discarded from VSP data 222. In one or more embodiments, model builder 212 selects only those ray paths from the set of output ray paths that actually connect a source to a receiver. The selected ray paths (or source and receiver combinations) and corresponding travel time data points from VSP data 222 may then be stored, for example, in memory 220. The stored data may then be used to perform further operations including, but not limited to, travel time inversion.

In one or more embodiments, the data points selected from VSP data 222 using the above-described forward modeling techniques may be incorporated into the global inversion process performed by inversion unit 214 for estimating anisotropy parameters of the 3D orthorhombic media within the selected layer(s) of the subsurface formation. As the ray tracing in such a medium may be highly nonlinear, the related inversion process may also be nonlinear. Such nonlinear geophysical inversion generally demands nonlinear optimization schemes to effectively estimate model parameters. One such optimization scheme that may be used in the disclosed embodiments is the differential evolution (DE) population based evolutionary global inversion scheme. It should be appreciated that any of various alternative non-linear optimization schemes may be used as desired for a particular implementation. However, it should also be appreciated that the DE scheme may offer advantages over other schemes in certain implementations. Such advantages may include, for example and without limitation, ease of use, better convergence properties relative to traditional genetic algorithms, fewer controlling parameters and easier parallelizability.

In one or more embodiments, inversion unit 214 may perform global inversion of the selected data points to estimate different sets of anisotropic parameters for the modeled layers of the subsurface formation, based on first arrival travel time data associated with the simulated seismic wave propagation, as described above. An optimal set of anisotropic parameters may then be selected from the different sets estimated for the layers of the initial 3D model by the global inversion, as will be described in further detail below with respect to FIGS. 3 and 4. In one or more embodiments, inversion unit 214 may perform the inversion process based on various inversion parameters 226 that are specific to the particular type of inversion scheme, e.g., DE or other type of inversion based on DE, being used to perform the global inversion. Using the DE scheme as an example, inversion parameters 226 may include, but are not limited to, the number of generations or iterations of the inversion to be performed, a crossover probability and a step size for the inversion. As will be described in further detail below, embodiments of the present disclosure may use a variation of the DE inversion scheme with a similar set of inversion parameters.

In one or more embodiments, inversion parameters 226 may also include an overburden file that designates at least one of the modeled formation layers as an overburden, for which no inversion is performed. Such an overburden file may be used as part of a windowed inversion scheme for inverting only a portion of the model at a time while keeping the designated layer as a fixed overburden. In some implementations, the inversion may be performed for all of the remaining layers of the 3D model simultaneously in order to help reduce uncertainty in the anisotropic parameter estimation. Such uncertainty may be due to seemingly acceptable values of anisotropic parameters for a single layer in the model that actually have deleterious effects on the travel time modeling of layers underneath that single layer. By performing the inversion for multiple layers simultaneously, such seemingly correct solutions that may be valid for a single layer get rejected because of large errors associated with receivers in deeper layers. Accordingly, this approach may also help to promote a more global solution for the modeled formation layers. As shown in the example of FIG. 2, inversion parameters 226 may be stored in memory 220. In some implementations, the values of inversion parameters 226 may be specified by user 202 via GUI 230 of system 200, as described above.

The optimal set of anisotropic parameters selected for the modeled subsurface formation layers in the above example may then be used to refine the initial 3D model. The refined 3D model may then be used to perform any of various seismic analysis and well planning operations for the subsurface formation. An example of such an operation is seismic imaging of the subsurface layers. Thus, as shown in the example of FIG. 2, image generator 216 of seismic simulator 210 may use the optimal set of anisotropy parameters to generate a seismic image of one or more of the subsurface formation layers. The generated seismic image may be presented to user 202 via, for example, a visualization window of GUI 230 rendered on a display (not shown) coupled to system 200. Other examples of well planning operations that may be performed using the refined 3D model include, but are not limited to, generating well placement or stimulation plans for drilling operations at one or more well sites, planning a well path or trajectory of a wellbore to be drilled through different layers of the formation, and adjusting or optimizing the planned path or trajectory of the wellbore as it is drilled through the formation.

While not shown in FIG. 2, it should be appreciated that system 200 may include additional components or data processing unit for performing various other seismic analysis and/or well planning operations. Additional details regarding the seismic simulation and global inversion operations performed by system 200 for estimating orthorhombic media parameters will be described below in reference to the illustrative processes of FIGS. 3 and 4.

Figure 3:
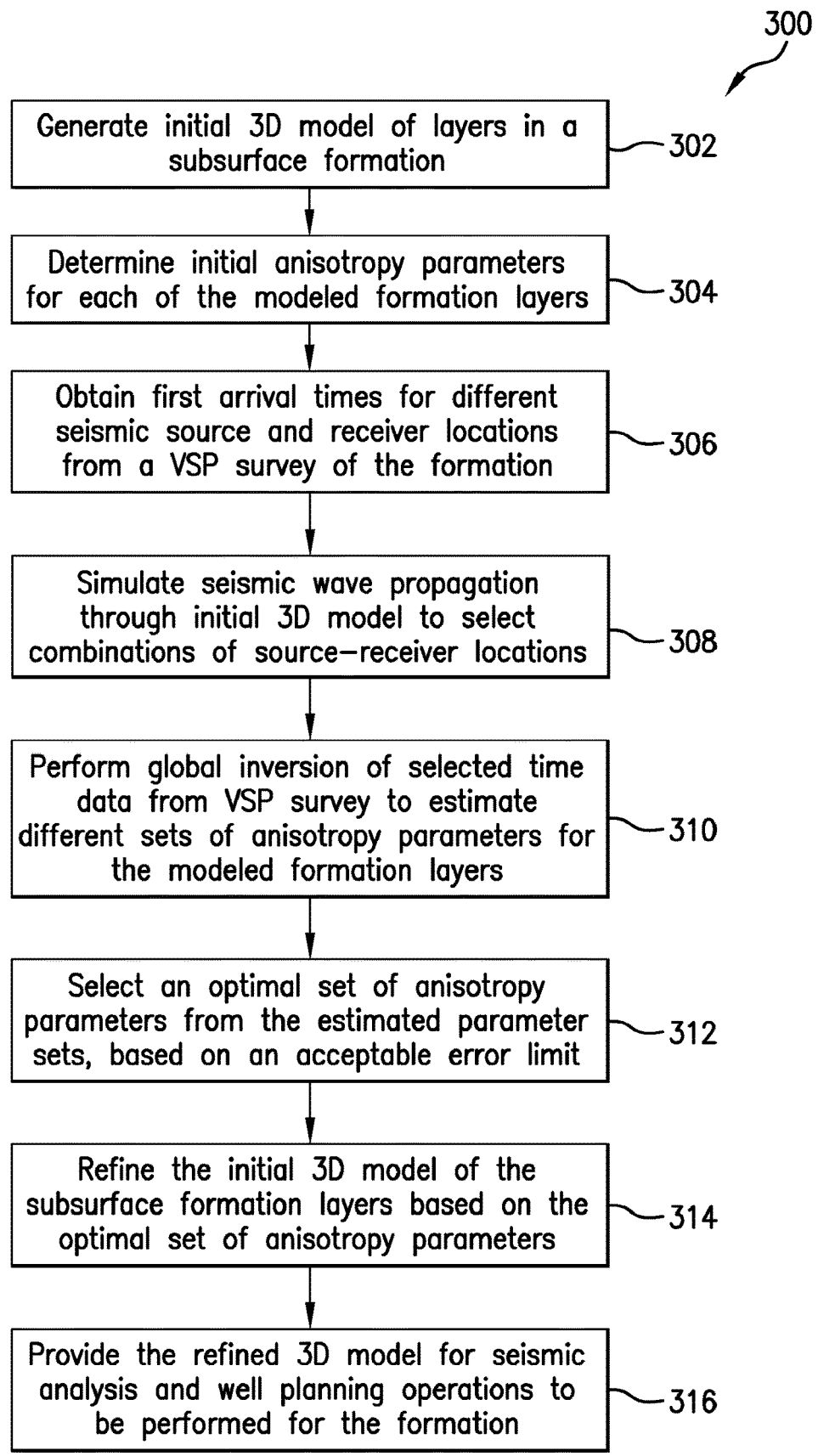
FIG. 3 is a flowchart of a process for generating an optimized three-dimensional (3D) model of orthorhombic subsurface formation layers based on orthorhombic anisotropy parameters estimated for the modeled subsurface layers.

FIG. 3 is a flowchart of a process 300 for generating an optimized or refined 3D model of orthorhombic subsurface formation layers based on orthorhombic anisotropy parameters estimated for the modeled subsurface layers. For discussion purposes, process 300 will be described using systems 100A and 100B of FIGS. 1A and 1B, respectively, as described above. However, process 300 is not intended to be limited thereto. Also, for discussion purposes, process 300 will be described using system 200 of FIG. 2, as described above, but is not intended to be limited thereto.

In the example shown in FIG. 3, process 300 begins in step 302, which includes generating an initial 3D model of one or more layers in a subsurface formation. The layers of the generated 3D may be based on layer interfaces picked from a specified seismic data source, e.g., one or more surface seismic depth images of the subsurface formation. For example, the seismic data may be obtained from a surface seismic survey conducted for the formation, e.g., using system 100A of FIG. 1A, as described above. In one or more embodiments, the seismic data source may be specified by a user, e.g., user 202 via GUI 230 of system 200 of FIG. 2, as described above.

Process 300 then proceeds to step 304, in which initial anisotropy parameters are estimated for each of the modeled formation layers of the generated 3D model. Such parameters may be estimated based on, for example, the surface seismic data used to generate the initial 3D model. In one or more embodiments, the initial anisotropy parameters may be used to define upper and lower limits of a model parameter search space for the global inversion to be performed in step 312, as will be described in further detail below.

In step 306, first arrival times are obtained for different seismic source and receiver locations from a VSP survey conducted for the formation, e.g., using system 100B of FIG. 1B, as described above. The first arrival times may be included, for example, in a list or table of direct P-wave travel time data for a plurality of seismic source and receiver locations associated with the VSP survey. In step 308, seismic wave propagation is simulated through the initial 3D model to select particular combinations of source and receiver locations from the plurality of source and receiver locations associated with the VSP survey. As described above, the simulation may be performed using anisotropic ray tracing (ART) techniques to simulate ray propagations between different seismic source and receiver combinations from the VSP survey data. In this way, the VSP survey may be simulated to identify and filter out any source and receiver combinations from the original VSP survey data, which produce ray paths that do not actually connect the source to the corresponding receiver.

In step 310, a global inversion is performed using data points that are selected from the VSP survey travel time data obtained in step 306 and that correspond to the selected combinations of seismic source and receiver locations from the simulation in step 308. The global inversion in step 310 may be performed using, for example, a global optimization scheme, e.g., differential evolution (DE) or a similar type of population based evolutionary scheme, as will be described in further detail below using FIG. 4.

Figure 4:
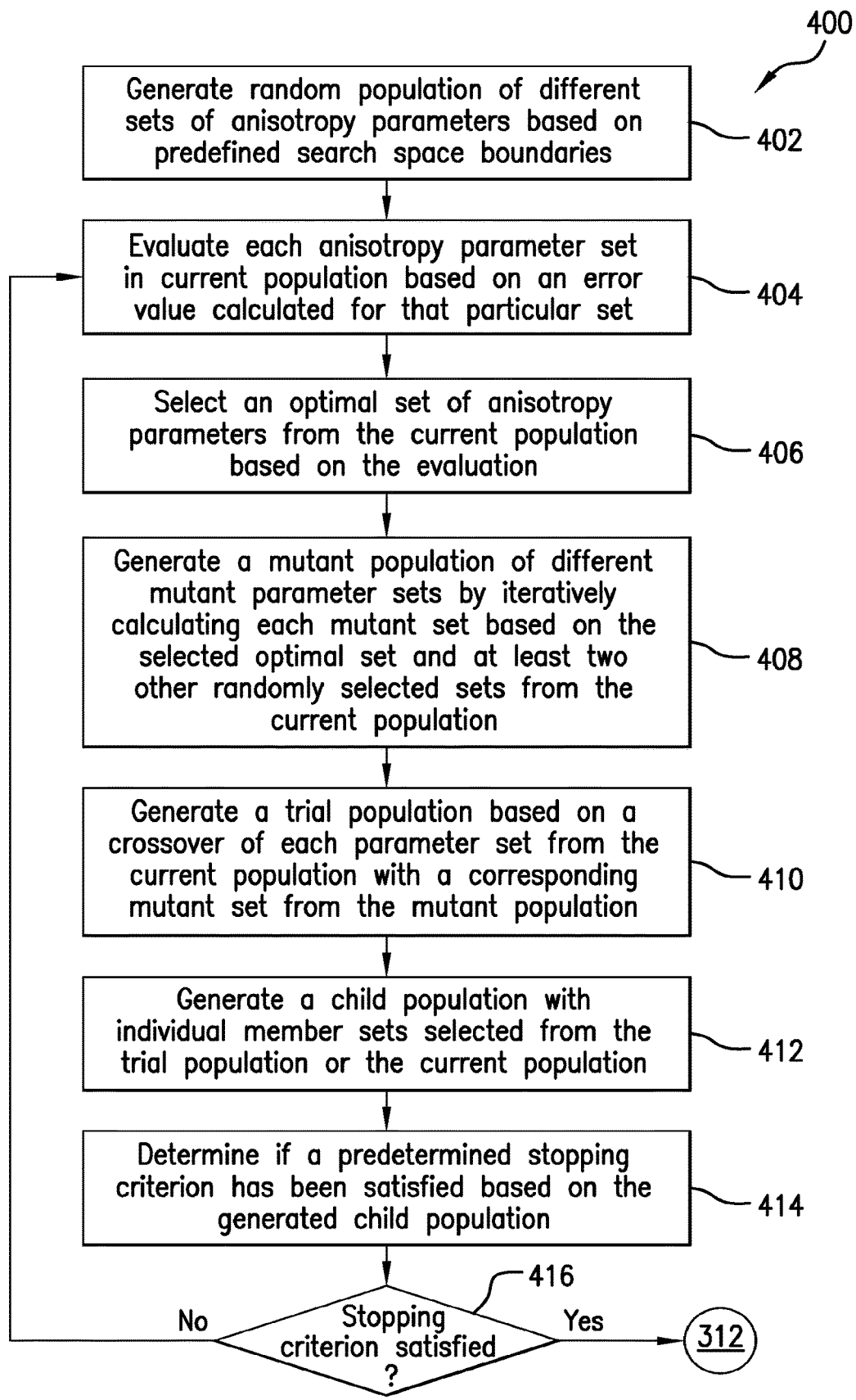
FIG. 4 is a flowchart of a global inversion process for estimating the orthorhombic anisotropy parameters of the subsurface formation layers in FIG. 3.

FIG. 4 is a flowchart illustrating an example of a population based evolutionary global inversion process 400 for estimating the orthorhombic anisotropy parameters of the modeled formation layers in FIG. 3. As shown in FIG. 4, process 400 may begin in step 402, in which a "random population" of different sets of anisotropy parameters is generated based on predefined search space boundaries. As described above with respect to step 304 of FIG. 3, the search space boundaries may be based on upper and lower limits of a model parameter search space defined by an initial approximation of anisotropy parameters for the modeled layers. Also, as described above, the initial approximation may be based on surface seismic data associated with the modeled formation layers.

In this example, the random population generated in step 402 may be an initial population (denoted "x") of randomly generated members (of size NP), which evolves over a number of generations or iterations to retain superior members and discard relatively inferior ones. Accordingly, each population member may represent a potential solution of the inversion problem. Further, each member may correspond to a different set of anisotropy parameters that describe the orthorhombic nature of all layers in the layered 3D media model (e.g., generated in step 302 of FIG. 3, as described above). Hence, if six parameters are used to describe the qP-wave propagation in each layer of a 3D model including four modeled layers, then each population member/solution would include 24 anisotropy parameters, e.g., in the form of a set or vector of parameters. The initial random population of members/solutions may be generated by, for example, choosing random numbers from the model search space defined in the neighborhood of the initial approximation or guess of anisotropic parameters for the model, as described above. The random number generator may use any kind of distribution without any issues in being able to still find a global solution to the inversion problem described herein.

The relative superiority or inferiority of each member at each generation or iteration of the inversion may be determined by performing an evaluation in step 404 of each set of anisotropy parameters in the current population as a potential solution to the inversion problem. It should be noted that the current population for each generation/iteration of the inversion in this example may refer to a current "parent population" used to generate a "child population" for that generation/iteration of the inversion. Thus, the current parent population for the first generation/iteration of the inversion may be the initial random population generated in step 402. For subsequent generations/iterations of the inversion, the current parent population may be the child population from a previous generation/iteration, as will be described in further detail below. In one or more embodiments, the evaluation in step 404 may be based on an error value calculated for each set of anisotropy parameters (or potential solution) within the current population. The error value may be calculated using, for example, an objective error function for calculating a root mean square (RMS) error associated with the estimated parameters in a given set based on the predefined search space boundaries. For example, the RMS error may be calculated based on differences between measured travel time data from an actual VSP survey of the subsurface formation layers (e.g., as obtained in step 306 of process 300 of FIG. 3, as described above) and simulated travel time data from a simulation of seismic wave propagation through a 3D model of the formation layers (e.g., as performed in step 308 of process 300). In step 406, an optimal set of anisotropy parameters may be selected from the current population based on the evaluation performed in step 404.

In step 408, a "mutant population" of different mutant parameter sets may be generated by iteratively calculating each mutant set based on the selected optimal set and at least two other randomly selected sets from the current parent population. The mutant population may be generated in step 408 using, for example, a variation of the DE inversion scheme described previously. In the DE inversion scheme example, the current parent population of parameter sets at each generation or iteration of the inversion may be transformed into a mutant population, e.g., using Equation (1):

$$v_i = x_{r1} + F(x_{r2} - x_{r3}) \quad (1),$$

where v is a mutant set or vector, i is an index from 1 to NP; r1, r2 and r3 represent three distinct members selected at random from the parent population x; and F is a predetermined or user-specified step size, e.g., a number between 0 and 2.

In one or more embodiments, a variation of Equation (1) that provides better convergence with relatively smaller population sizes (often referred to as a "jitter" scheme) may be used instead. In such a scheme, the step size F may be made to vary for each model parameter in each mutant parameter set calculated for every generation, as illustrated by Equations (2) and (3):

$$v_{i,j} = x_{best(i,j)} + (F\text{new}_{i,j})(x_{r2,j} - x_{r3,j}) \quad (2),$$

where $x_{best}$ represents the best or most optimal population member of an already generated population from a previous step, and:

$$F\text{new}_{i,j} = F + 0.0001 * \text{rand} \quad (3),$$

where rand may be any random number (e.g., of uniform distribution between 0 and 1) generated for each model parameter in the set or vector. Thus, Equations (2) and (3) may be used to evolve the initial random population generated in step 402 over multiple generations/iterations of the inversion such that the population's member slots (from 1 to NP) get progressively filled with relatively superior solutions.

After a mutant population v has been generated in step 408, a trial population u may be generated in step 410 based on a crossover of each parameter set from the current population with a corresponding mutant set from the mutant population, as illustrated by Equation (4):

$$u_{ij} = v_{ij}, \text{ if } \text{rand}_j \Leftarrow CR,$$

else $$u_{ij} = x_{ij} \quad (4)$$

In Equation (4), CR may represent a crossover probability/rate similar to those commonly used in various genetic algorithms and rand may be a random number generated for each model parameter in the set or vector, similar to that of Equation (3).

Process 400 then proceeds to step 412, in which a child population is generated with its individual member sets selected from the trial population or the current parent population. The child population generated in step 412 may be based on, for example, a comparison between each member of the trial population with a corresponding member of the parent population for the current generation/iteration of the inversion. The comparison may be on the basis of the objective function error value computed for each member of both the trial and parent (e.g., initial random) populations. For each slot of the child population, the corresponding parent and trial population members are compared and the superior solution/member is retained or selected for the new child population being generated. The superior solution/member for each slot may be, for example, a member of either the parent or trial population that has the lesser objective error value.

In steps 414 and 416, a determination is made as to whether or not a predetermined stopping criterion has been satisfied based on the child population generated in step 414. The stopping criterion may be, for example, a specified number of generations/iterations, an acceptable objective value level or some other heuristic criteria, as will be described in further detail below. Such criteria may be specified based on, for example, input from a user (e.g., user 202 of FIG. 2, as described above) for the inversion to be performed and may be stored as part of inversion parameters (e.g., inversion parameters 226 of FIG. 2, as described above), which may be provided as input for the inversion.

In steps 414 and 416, if it is determined that at least one stopping criterion has not been satisfied, process 400 repeats steps 404 through 416 for another iteration of the inversion. The members of the child population may be stored in memory (e.g., memory 220 of FIG. 2, as described above) along with their corresponding error values for later use. However, if it is determined in steps 414 and 416 that the stopping criterion has been satisfied, process 400 concludes and the results of the inversion may be returned for use in step 312 of FIG. 3, as will be described further below.

Referring back to process 300 of FIG. 3, an optimal set of anisotropy parameters may be selected in step 312 from the different sets of anisotropy parameters estimated by the global inversion performed in step 310, e.g., the results of inversion process 400 of FIG. 4, as described above. The selection in step 312 may be based on, for example, an acceptable error limit calculated based on the inversion results. The results of the inversion may include, for example, the different sets of anisotropy parameters in the current child population that was generated in the final iteration of the inversion. In step 314, the initial 3D model of the subsurface formation layers may be refined based on the optimal set of anisotropy parameters selected in step 312.

In one or more embodiments, the results of the inversion may also include different sets of populations archived over multiple generations of the above-described inversion process of FIG. 4. For example, members of each child population generated in step 412 may be archived after each iteration of the inversion process. After the inversion process is complete, all population members over all generations may be used along with their corresponding objective (error) values to calculate a mean model and related standard deviation. Such a mean model and standard deviation may be needed to find additional solutions beyond the selected optimal solution, which may also be useful to analyze potential multimodal or objective function hyper-surface issues that may arise in the inversion problem, particularly when the inversion is performed on data that includes noise. Hence, there may be several solutions within an acceptable error limit that could be useful for such noisy data analysis.

In one or more embodiments, such an error limit for the acceptance of one or more solutions out of all archived solutions produced by the inversion may be based on a root mean square (RMS) error. The RMS error may be calculated, for example, in the neighborhood of the objective space between the field and simulated travel time data. Such a neighborhood may be chosen around the best or optimal objective value determined for a given generation/iteration of the inversion process. Thus, in step 314, the initial 3D model of the subsurface formation layers may be refined after taking into account all solutions that were chosen on such basis and calculating a mean model and standard deviation. Such a mean model may provide a more robust solution for identifying rock types than using the best or optimal solution selected from only one population, e.g., the population generated from the final iteration of the inversion. The "best" or "optimal" solution as used herein may refer to, for example, a solution that fits kinematic field data well although it may deviate from the ground truth at times due to noise issues. In step 316, the refined 3D model may be provided for seismic analysis and well planning operations to be performed for the subsurface formation. Such operations may include, but are not limited to, seismic imaging of the subsurface formations.

As described above, the disclosed global inversion scheme may be used to estimate one or more optimal sets of orthorhombic media parameters for modeled layers with search space boundaries that are defined for each model parameter and guided by the initial guess or approximation. Due to non-uniqueness of solutions to such an inverse problem, it may be necessary to enforce smoothness constraints on the solutions/sets. In one or more embodiments, a penalty term may be added to an objective evaluation function for evaluating solutions that have more than two model parameters hitting the predefined search space boundaries. A penalty term may also be added to the objective value for any solution that produces synthetic travel time data indicating a DC shift with respect to the observed data for any receiver used in the inversion process. Such an additional penalty term may be used, for example, to discourage solutions that may appear to be a good overall match with observed field data when all receivers are considered together in combination while also appearing to mismatch the data when each receiver is considered individually or separately from other receivers in the inversion. Since calculation of the objective values is computationally intensive due to the nature of the forward modeling problem, a parallel approach may be used for the evaluation of the objective function.

It should be noted that such parallel evaluation may be performed independently for each population member/solution. It should also be noted that the generation of the mutant and trial populations may also be parallelizable and help to improve computational efficiency. Also, parallelization of such objective value evaluations combined with ART parallelization (as each two point ray computation is independent of each other) may play a critical role in improving the overall performance and practicality of the global inversion based parameter estimation and modeling techniques disclosed herein.

FIGS. 5-13B illustrate an example of a practical application of the disclosed global inversion based modeling techniques of processes 300 and 400 of FIGS. 3 and 4, respectively, for estimating orthorhombic media parameters. This example will be described in the context of synthetic travel time data as "observed" from a simulated VSP survey of a subsurface formation. However, it should be appreciated that these techniques also may be applied to actual travel time data from a real-world VSP survey of the formation. The simulation and generated synthetic travel time data in this example may be based on the 3D formation layer models shown in FIGS. 5 and 6.

Figure 5:
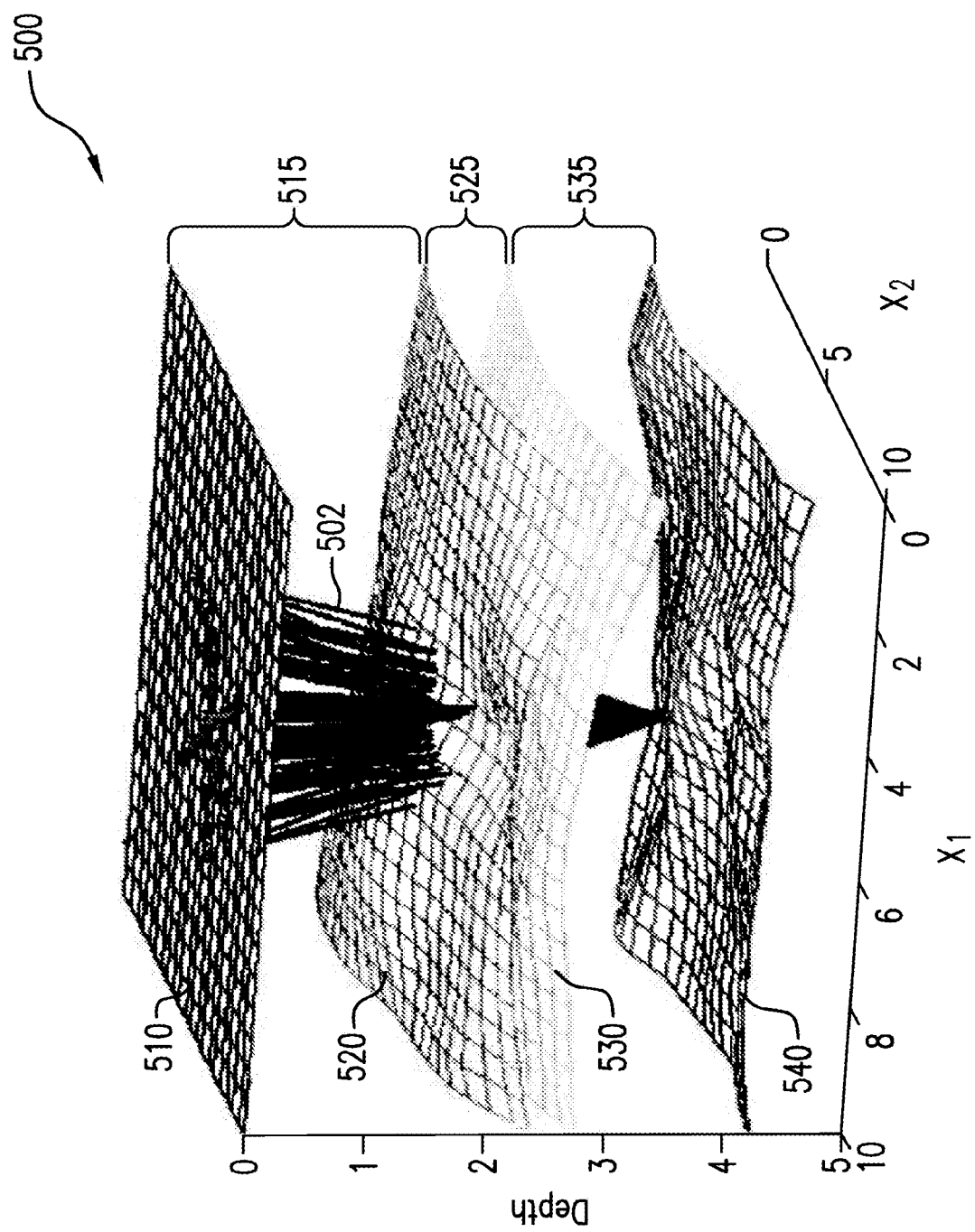
FIG. 5 is a diagram showing an example of a seismic source-receiver configuration with a 3D layered model for simulating seismic wave propagation through different modeled formation layers using the process of FIG. 3.

In particular, FIG. 5 is a diagram of a 3D layered model 500 with a seismic source and receiver configuration for simulating seismic wave propagation through different modeled formation layers. As shown in FIG. 5, 3D model 500 includes various modeled geologic interfaces 510, 520, 530 and 540 along with an arrangement of multiple seismic sources and receivers connected by a plurality of rays 502. Such interfaces may correspond to different upper and lower interfaces of modeled formation layers 515, 525 and 535. For example, interface 510 may correspond to the upper interface of a top layer 515 of the modeled formation. Interface 520 may correspond to the lower interface of layer 515 as well as the upper interface of layer 525.

Interface 510 may also correspond to a surface of the formation. The seismic sources in this example may be located on the surface of the formation in a multi-azimuthal arrangement with the receivers located at some predetermined depth in a borehole within the formation. Rays 502 may represent different seismic source and receiver combinations selected for the inversion. For purposes of the inversion described in this example, it may be assumed that the first or top layer 515 of model 500 has been designated as the overburden. Accordingly, the inversion may be performed for only layers 525 and 535. Also, it may be assumed for purposes of this example that the top layer 515 is isotropic while layer 525 is orthorhombic and layer 535 is transversely isotropic.

Figure 6:
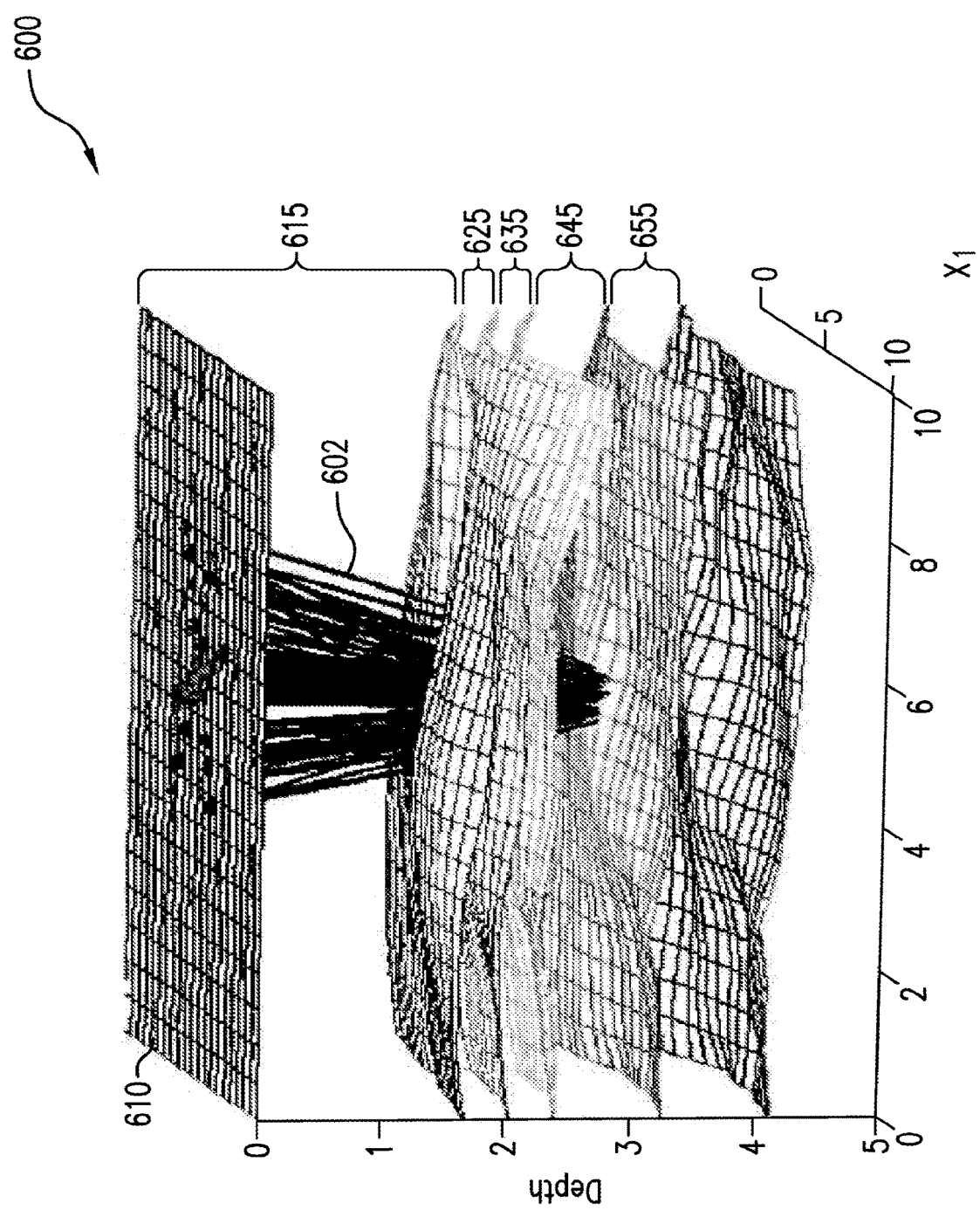
FIG. 6 is a diagram showing an example of a seismic source-receiver configuration with an over-parameterized 3D layered model based on orthorhombic anisotropy parameters estimated for modeled layers using the simulation and inversion processes of FIGS. 3 and 4.

FIG. 6 is a diagram showing an example of a source-receiver configuration with an over-parameterized 3D layered model 600 for estimating orthorhombic anisotropy parameters of modeled formation layers. In this example, the orthorhombic anisotropy parameters for the layers of model 600 may be estimated from the travel time data generated using model 500 of FIG. 5, as described above. Like FIG. 5, the source-receiver configuration in FIG. 6 may include a plurality of sources in a multi-azimuthal arrangement on a surface interface 610 of model 600 with rays 602 connecting each source to receivers located within a borehole at some predetermined depth within the formation. The parameters in this mode may be estimated using, for example, processes 300 and 400 of FIGS. 3 and 4, respectively, as described above. As shown in FIG. 6, model 600 includes layers 615, 625, 635, 645 and 655. As in FIG. 5, it may be assumed that the first or top layer 615 of model 600 is the designated overburden. Accordingly, the inversion may be performed for the remaining four layers 625, 635, 645 and 655. Unlike FIG. 5, all four of these layers may be assumed to be orthorhombic.

Figure 7:
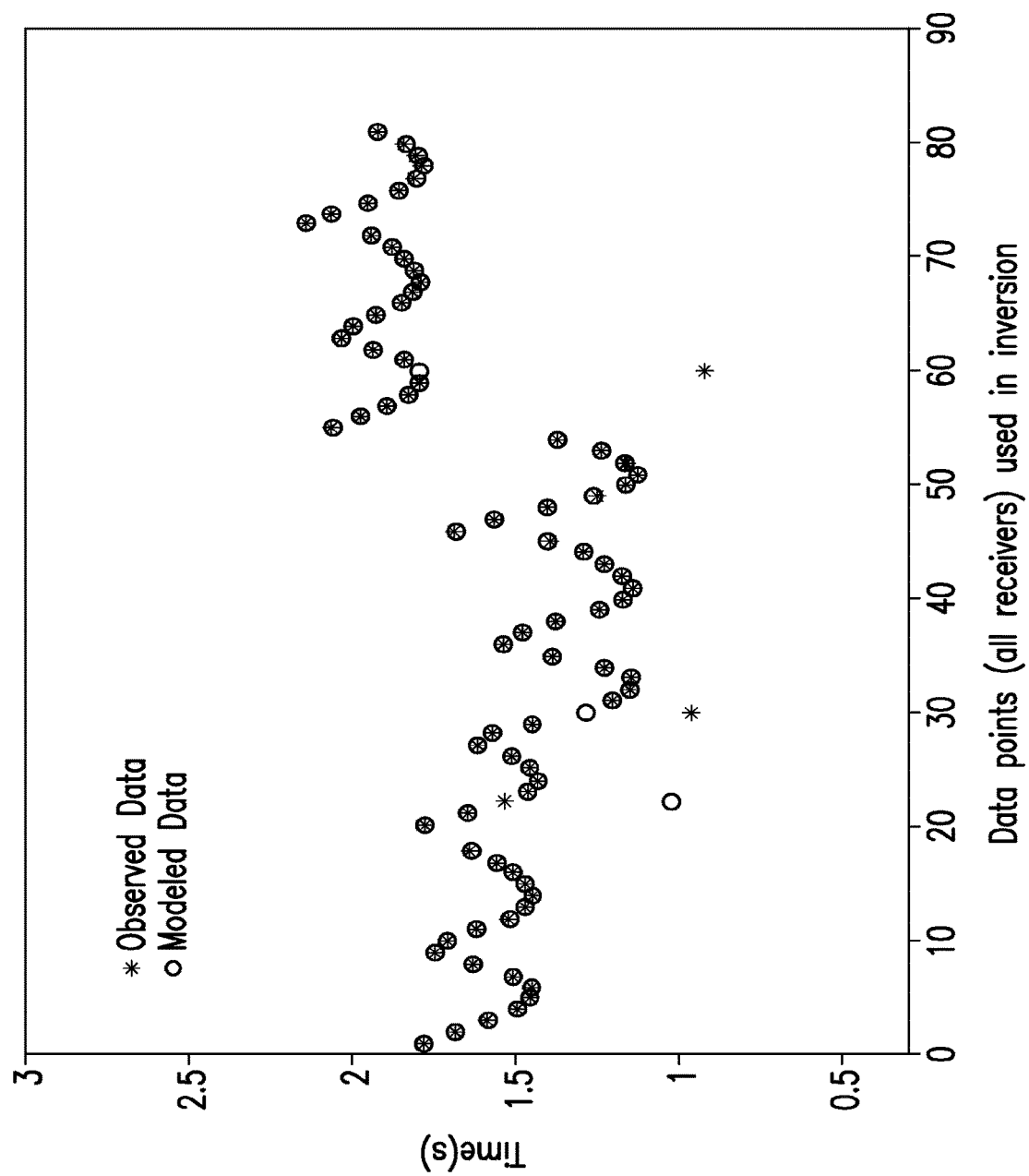
FIG. 7 is a data plot showing a comparison between true or observed P-wave first arrival travel time data and travel time data obtained using the optimized 3D model generated by the processes of FIGS. 3 and 4.

As the synthetic travel time field data was generated using model 500 of FIG. 5, model 500 for purposes of this example may be considered a "true" or accurate representation of the actual subsurface formation layers being modeled. As model 600 includes more layers than model 500 and none of the layer interfaces of model 600 exactly match or overlie any of the layer interfaces of model 500, model 600 in this example may represent an initial approximation of the subsurface layers. Such a mismatch between an initial layered formation model (e.g., model 600) and the actual formation layers or "true" model thereof (e.g., model 500) may be representative of the inversion problem in the real world, as the exact positions of the interfaces in the actual physical subsurface formation can only be approximately imaged in depth. As demonstrated by the data plots in FIGS. 7-13B described below, the global inversion and parameter estimation techniques disclosed herein may still be used to provide a relatively accurate estimate of the orthorhombic media parameters for the (over-parameterized) modeled layers of model 600 based on the same dataset that was generated using model 500. Thus, the disclosed techniques may be used to yield an optimized model parameter set that effectively explains a given seismic dataset for a subsurface formation, even in cases where the modeled formation layers (e.g., of model 600) are inaccurate or inconsistent with the layer interfaces of the actual formation in the real world. FIG. 7 is a data plot showing a comparison between the true or "observed" P-wave first arrival travel time data and travel time data generated using the optimized or mean model obtained from the inversion performed using processes 300 and 400 of FIGS. 3 and 4, respectively, as described above. To reflect real-world conditions, certain data points may include random noise (e.g., with a maximum amplitude of 4 ms) that was added to the observed data. For example, random noise with a maximum amplitude of 4 ms may be added to the P-wave first arrival travel time synthetic "observed" data used in the inversion.

Figure 8B:
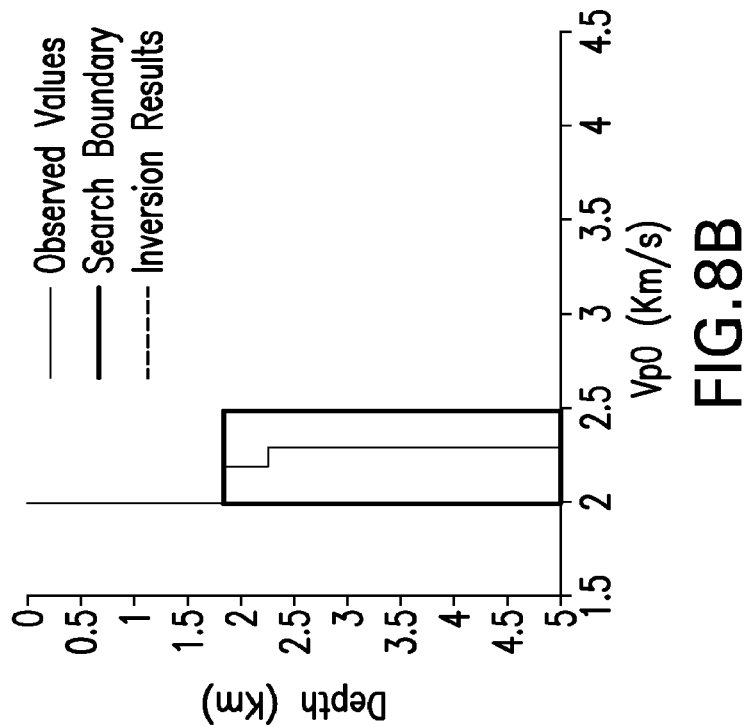
FIGS. 8A and 8B are data plots showing a comparison of $V_{P0}$ velocity profiles resulting from the processes of FIGS. 3 and 4 when the inversion is performed with noise in the data and without noise, respectively.
Figure 8A:
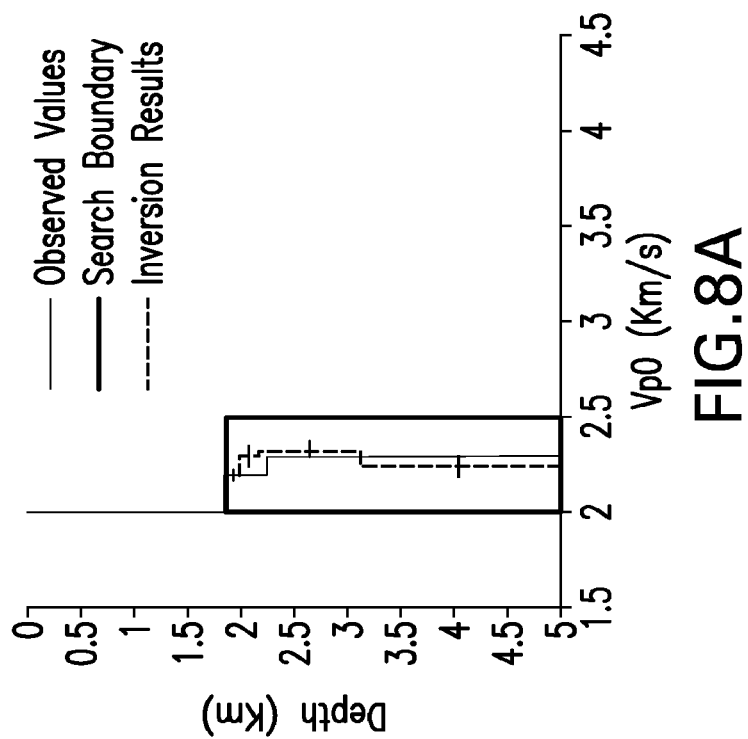
Figure 9B:
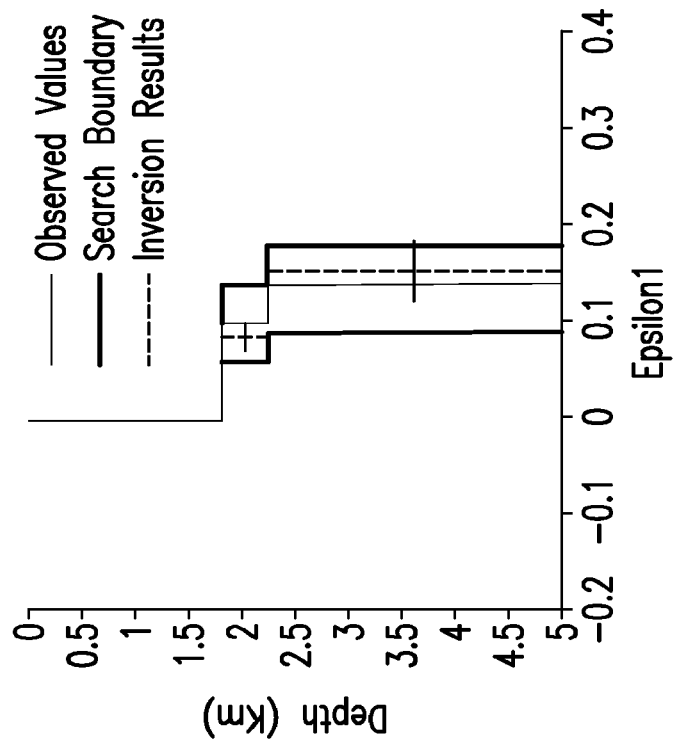
FIGS. 9A and 9B are plot diagrams showing a comparison of $\varepsilon 1$ anisotropy parameter profiles resulting from the processes of FIGS. 3 and 4 when the inversion is performed with noise in the data and without noise, respectively.
Figure 9A:
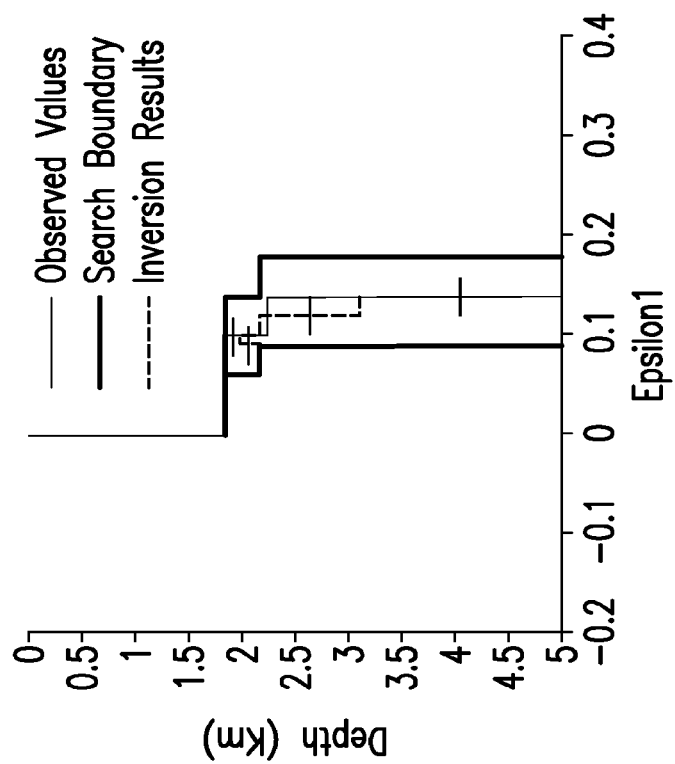
Figure 10B:
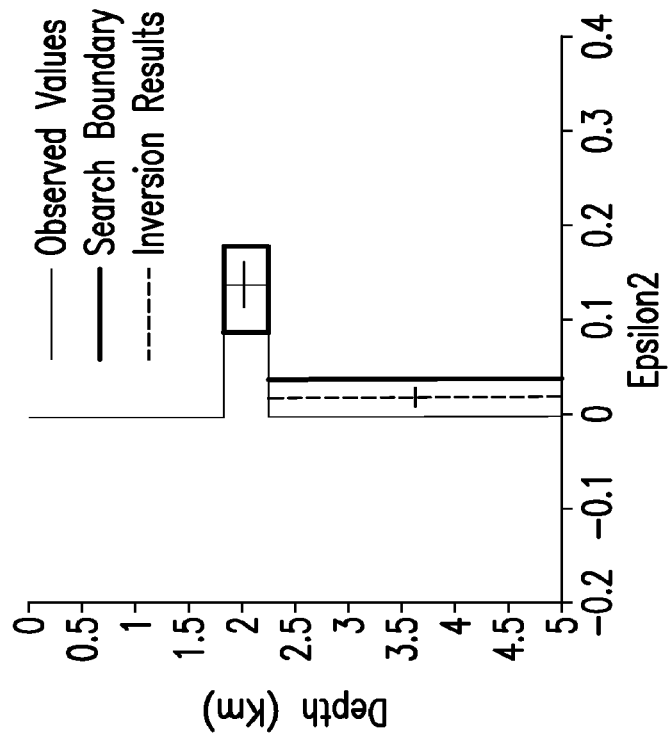
FIGS. 10A and 10B are plot diagrams showing a comparison of $\varepsilon 2$ anisotropy parameter profiles resulting from the processes of FIGS. 3 and 4 when the inversion is performed with noise in the data and without noise, respectively.
Figure 10A:
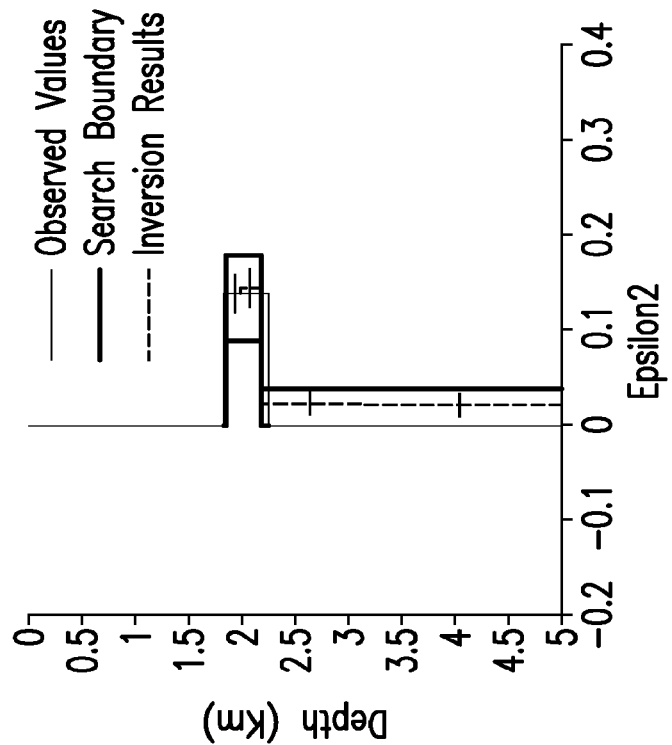
Figure 11B:
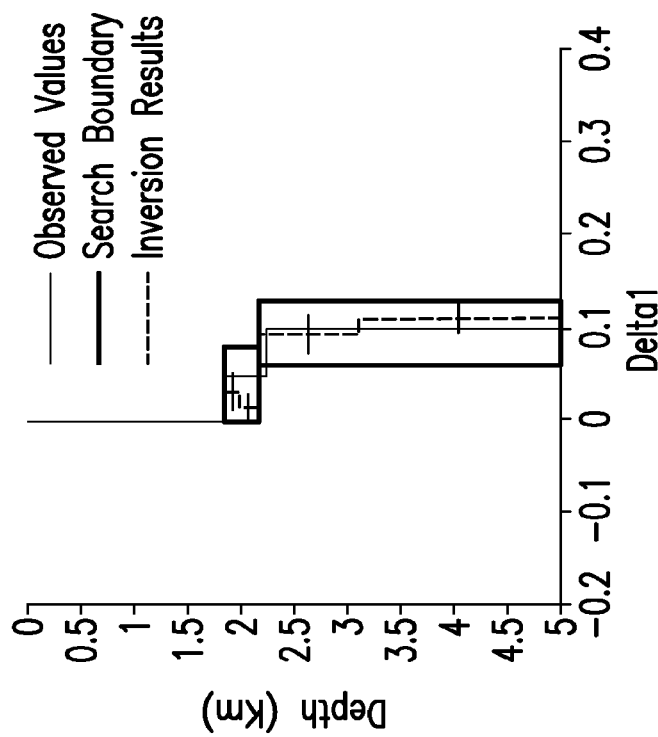
FIGS. 11A and 11B are plot diagrams showing a comparison of $\delta 1$ anisotropy parameter profiles resulting from the processes of FIGS. 3 and 4 when the inversion is performed with noise in the data and without noise, respectively.
Figure 11A:
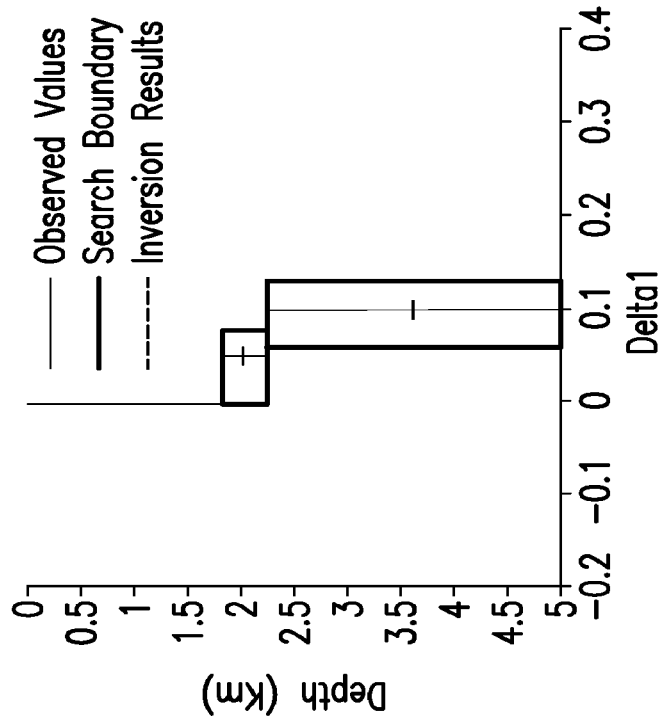
Figure 12B:
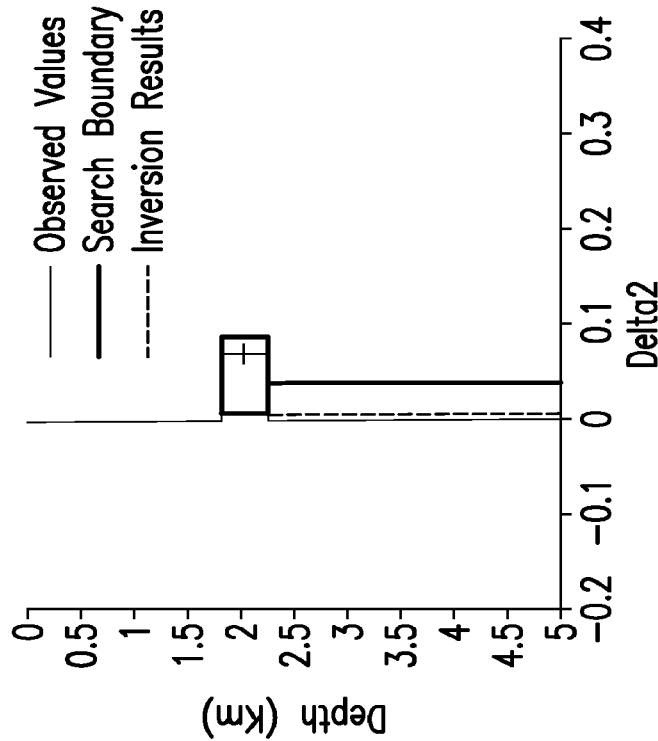
FIGS. 12A and 12B are plot diagrams showing a comparison of $\delta 2$ anisotropy parameter profiles resulting from the processes of FIGS. 3 and 4 when the inversion is performed with noise in the data and without noise, respectively.
Figure 12A:
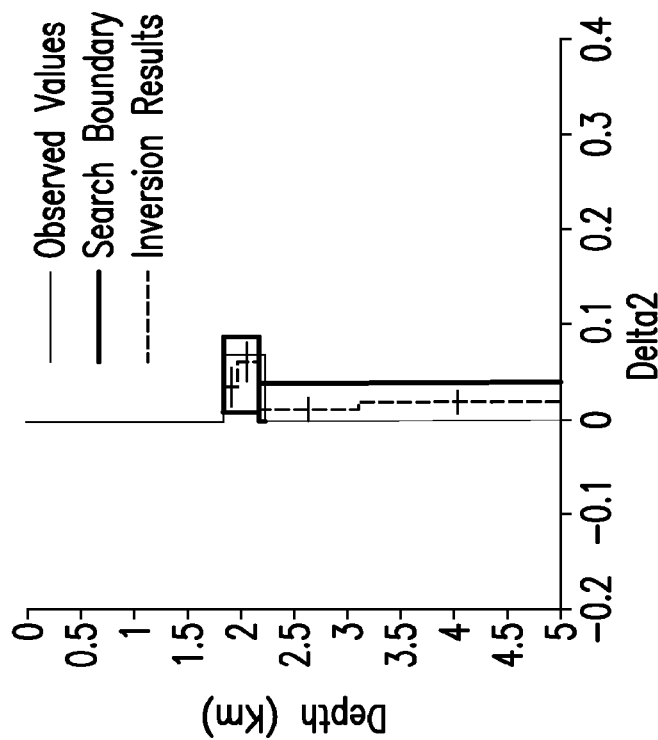
Figure 13B:
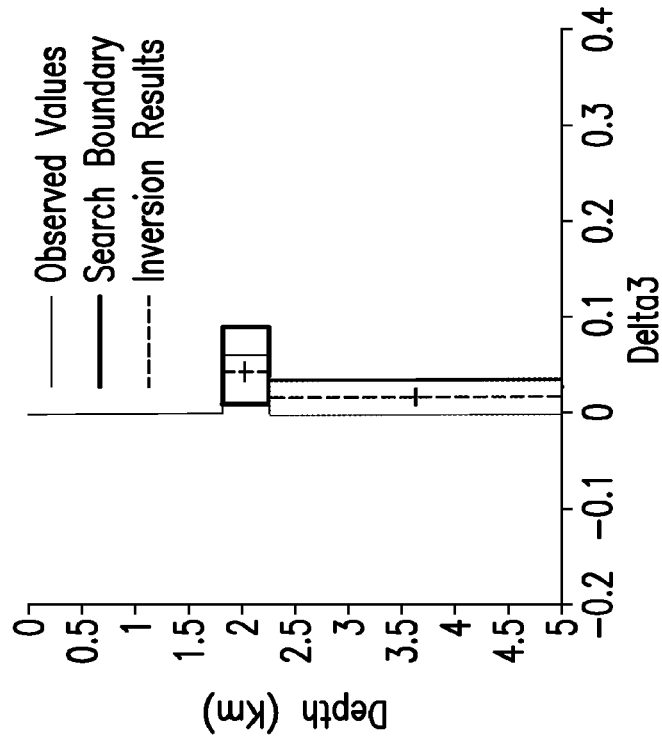
FIGS. 13A and 13B are plot diagrams showing a comparison of $\delta 3$ anisotropy parameter profiles resulting from the processes of FIGS. 3 and 4 when the inversion is performed with noise in the data and without noise, respectively.

FIGS. 8A-13B are additional data plots showing comparisons between true or observed values and estimated values (or "inversion results") resulting from the inversion process of FIG. 4 performed for different orthorhombic media parameters within specified search boundaries. In particular, FIGS. 8A and 8B are data plots showing a comparison of $V_{P0}$ velocity profiles resulting from the processes of FIGS. 3 and 4 when the inversion is performed with noise in the data and without noise, respectively. FIGS. 9A and 9B are plot diagrams showing a comparison of $\varepsilon 1$ anisotropy parameter profiles resulting from the processes of FIGS. 3 and 4 when the inversion is performed with noise in the data and without noise, respectively. FIGS. 10A and 10B are plot diagrams showing a comparison of $\varepsilon 2$ anisotropy parameter profiles resulting from the processes of FIGS. 3 and 4 when the inversion is performed with noise in the data and without noise, respectively. FIGS. 11A and 11B are plot diagrams showing a comparison of $\delta 1$ anisotropy parameter profiles resulting from the processes of FIGS. 3 and 4 when the inversion is performed with noise in the data and without noise, respectively. FIGS. 12A and 12B are plot diagrams showing a comparison of $\delta 2$ anisotropy parameter profiles resulting from the processes of FIGS. 3 and 4 when the inversion is performed with noise in the data and without noise, respectively. FIGS. 13A and 13B are plot diagrams showing a comparison of $\delta 3$ anisotropy parameter profiles resulting from the processes of FIGS. 3 and 4 when the inversion is performed with noise in the data and without noise, respectively.

The inversion result for each of the parameter profiles shown in FIGS. 8A-13B may represent a mean inversion solution, i.e., based on the mean inversion model as described above. The data plots in FIGS. 8A, 9A, 10A, 11A, 12A and 13A show that the disclosed global inversion techniques converge to a fairly accurately solution in the presence of noise in the data and even with a fairly complicated configuration of sources and receivers in a laterally inhomogeneous subsurface with anisotropic effects. The data plots in FIGS. 8B, 9B, 10B, 11B, 12B and 13B show that under ideal conditions, e.g., when the interfaces are exactly known and travel times are without any noise, the layer parameters are retrieved with much more confidence. The data plots in FIGS. 8B and 11B in particular show inversion results with very little or no deviation from observed values.

Figure 13A:
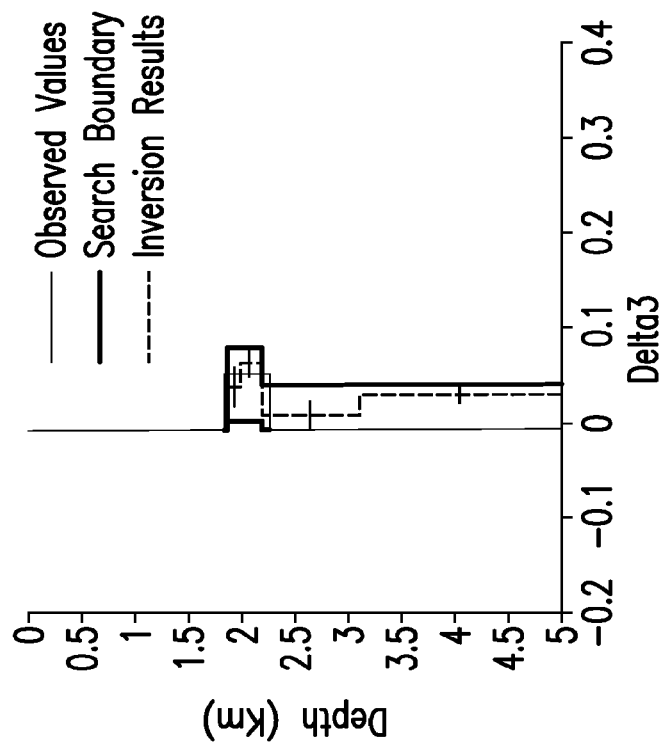

In the presence of noise, the data plots reveal that certain parameters (e.g., $V_{P0}$, $\varepsilon 1$ and $\varepsilon 2$ in FIGS. 8A, 9A and 10A, respectively) may be better constrained than others (e.g., $\delta 1$, $\delta 2$ and $\delta 3$ of FIGS. 11A, 12A and 13A, respectively). This may be attributed to the inherent non-uniqueness of the inverse problem and the difference in sensitivity of the dataset to the various parameters. As the sensitivity of the dataset generally depends on the acquisition setup of shots and receivers, further investigation may be performed into different shot-receiver configurations in which the shots and receivers are positioned in optimal locations according to the type of data or particular parameter for which the data is being acquired. However, this may not be practical in real world conditions, as there may be many factors that can influence the acquisition of data for different parameters. Despite the inadequacy of the data and ill-posed nature of the inverse problem in the real-world, the disclosed parameter estimation and inversion techniques are sufficiently robust to produce relatively accurate results in such conditions, as demonstrated by the data plots and comparisons shown in FIGS. 7-13B.

Figure 14:
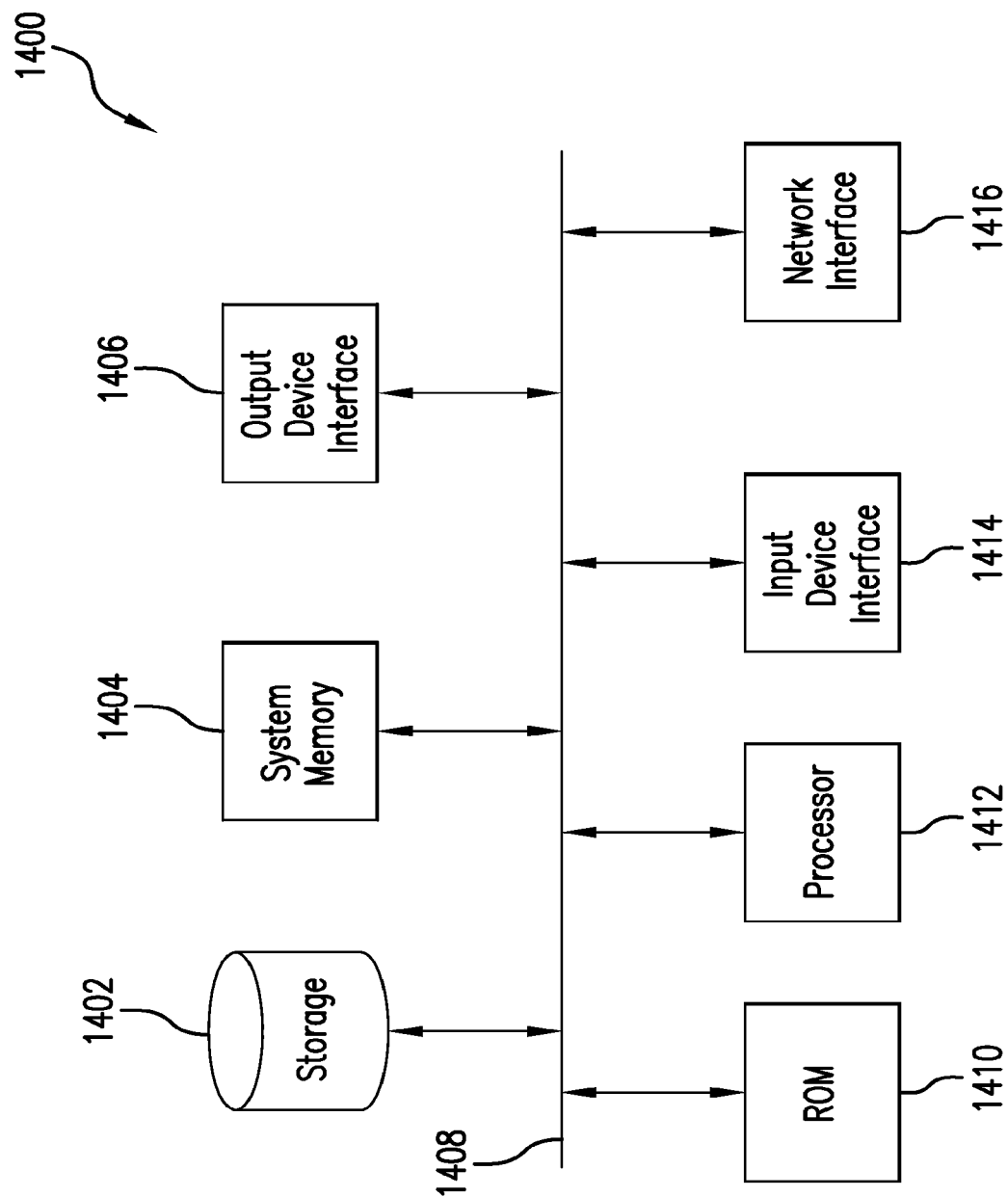
FIG. 14 is a block diagram of an exemplary computer system in which embodiments of the present disclosure may be implemented.

FIG. 14 is a block diagram of an exemplary computer system 1400 in which embodiments of the present disclosure may be implemented. System 1400 can be a computer, phone, PDA, or any other type of electronic device. Such an electronic device includes various types of computer readable media and interfaces for various other types of computer readable media. As shown in FIG. 14, system 1400 includes a permanent storage device 1402, a system memory 1404, an output device interface 1406, a system communications bus 1408, a read-only memory (ROM) 1410, processing unit(s) 1412, an input device interface 1414, and a network interface 1416.

Bus 1408 collectively represents all system, peripheral, and chipset buses that communicatively connect the numerous internal devices of system 1400. For instance, bus 1408 communicatively connects processing unit(s) 1412 with ROM 1410, system memory 1404, and permanent storage device 1402.

From these various memory units, processing unit(s) 1412 retrieves instructions to execute and data to process in order to execute the processes of the subject disclosure. The processing unit(s) can be a single processor or a multi-core processor in different implementations.

ROM 1410 stores static data and instructions that are needed by processing unit(s) 1412 and other modules of system 1400. Permanent storage device 1402, on the other hand, is a read-and-write memory device. This device is a non-volatile memory unit that stores instructions and data even when system 1400 is off. Some implementations of the subject disclosure use a mass-storage device (such as a magnetic or optical disk and its corresponding disk drive) as permanent storage device 1402.

Other implementations use a removable storage device (such as a floppy disk, flash drive, and its corresponding disk drive) as permanent storage device 1402. Like permanent storage device 1402, system memory 1404 is a read-and-write memory device. However, unlike storage device 1402, system memory 1404 is a volatile read-and-write memory, such a random access memory. System memory 1404 stores some of the instructions and data that the processor needs at runtime. In some implementations, the processes of the subject disclosure are stored in system memory 1404, permanent storage device 1402, and/or ROM 1410. For example, the various memory units include instructions for computer aided pipe string design based on existing string designs in accordance with some implementations. From these various memory units, processing unit(s) 1412 retrieves instructions to execute and data to process in order to execute the processes of some implementations.

Bus 1408 also connects to input and output device interfaces 1414 and 1406. Input device interface 1414 enables the user to communicate information and select commands to the system 1400. Input devices used with input device interface 1414 include, for example, alphanumeric, QWERTY, or T9 keyboards, microphones, and pointing devices (also called "cursor control devices"). Output device interfaces 1406 enables, for example, the display of images generated by the system 1400. Output devices used with output device interface 1406 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 14, bus 1408 also couples system 1400 to a public or private network (not shown) or combination of networks through a network interface 1416. Such a network may include, for example, a local area network ("LAN"), such as an Intranet, or a wide area network ("WAN"), such as the Internet. Any or all components of system 1400 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, system 200 of FIG. 2 as well as the steps of processes 300 and 400 of FIGS. 3 and 4, respectively, as described above, may be implemented using system 1400 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the exemplary methodologies described herein may be implemented by a system including processing circuitry or a computer program product including instructions which, when executed by at least one processor, causes the processor to perform any of the methodology described herein.

As described above, embodiments of the present disclosure are particularly useful for estimating orthorhombic anisotropy parameters of subsurface rock layers. Advantages of the present disclosure include, but are not limited to, providing a robust global inversion technique for estimating such orthorhombic parameters in the presence of noise in the data or in cases where the modeled formation layers may be inaccurate or inconsistent with the layer interfaces of the actual formation. The disclosed parameter estimation and inversion techniques may allow, for example, users of seismic analysis applications to better image and interpret seismic data and understand geo-mechanical phenomena relative to conventional seismic imaging and analysis techniques.

In at least one embodiment of the present disclosure, a computer-implemented method of estimating orthorhombic anisotropy parameters of subsurface rock layers includes: generating an initial three-dimensional (3D) model of layers in a subsurface formation; obtaining travel time data for a plurality of seismic source and receiver locations associated with a vertical seismic profile (VSP) survey of the subsurface formation; simulating seismic wave propagation through each layer of the initial 3D model to select particular combinations of seismic source and receiver locations from the plurality of seismic source and receiver locations associated with the VSP survey, based on the travel time data; performing a global inversion of data points selected from the obtained travel time data to estimate different sets of anisotropy parameters for the layers of the initial 3D model, based on the simulation, the selected data points corresponding to the selected combinations of seismic source and receiver locations; refining the initial 3D model with an optimal set of anisotropy parameters selected from the different sets of anisotropy parameters estimated for the layers of the initial 3D model by the global inversion; and providing the refined 3D model for seismic analysis and well planning operations to be performed for the subsurface formation.

Further, a computer-readable storage medium with instructions stored therein has been described, where the instructions when executed by a computer cause the computer to perform a plurality of functions, including functions to: generate an initial three-dimensional (3D) model of layers in a subsurface formation; obtain travel time data for a plurality of seismic source and receiver locations associated with a vertical seismic profile (VSP) survey of the subsurface formation; simulate seismic wave propagation through each layer of the initial 3D model to select particular combinations of seismic source and receiver locations from the plurality of seismic source and receiver locations associated with the VSP survey, based on the travel time data; perform a global inversion of data points selected from the obtained travel time data to estimate different sets of anisotropy parameters for the layers of the initial 3D model, based on the simulation, the selected data points corresponding to the selected combinations of seismic source and receiver locations; refine the initial 3D model with an optimal set of anisotropy parameters selected from the different sets of anisotropy parameters estimated for the layers of the initial 3D model by the global inversion; and provide the refined 3D model for seismic analysis and well planning operations to be performed for the subsurface formation.

For the foregoing embodiments, the initial 3D model may be generated by: obtaining formation data related to one or more layers of the subsurface formation from at least one data source; generating the initial 3D model of the one or more layers based on the corresponding formation data obtained from the data source; and determining anisotropy parameters for each layer of the generated initial 3D model, based on the obtained formation data. The data source may be a surface seismic survey of the subsurface formation, and the obtained formation data may be a surface seismic depth image generated based on the surface seismic survey. The travel time data may include first arrival times of seismic wave propagations between a plurality of seismic sources located in a multi-azimuthal arrangement at a surface of a borehole drilled into the one or more layers of the subsurface formation and an array of seismic receivers located within the borehole.

Simulating seismic wave propagation may include: simulating ray propagations between different seismic sources in the plurality of seismic sources located at the surface and different seismic receivers in the array of seismic receivers located within the borehole, based on the initial 3D model and the plurality of seismic source and receiver locations associated with the obtained travel time data; identifying source and receiver combinations from the plurality of seismic source and receiver locations for which the simulated ray propagations from the seismic sources do not connect the corresponding seismic receivers; and selecting the particular combinations of seismic source and receiver locations so as to filter out the identified source and receiver combinations from the plurality of seismic source and receiver locations. The simulation may be performed using anisotropic ray tracing (ART).

Performing the global inversion may include: generating a parent population of different sets of anisotropy parameters based on predefined parameter search space boundaries; evaluating each set of anisotropy parameters in the generated parent population, based on an error value calculated for that set of anisotropy parameters; selecting an optimal set of anisotropy parameters from the parent population, based on the evaluation; generating a mutant population of mutant parameter sets based on the optimal set of anisotropy parameters selected from the parent population; generating a trial population based on a crossover between the parent population and the generated mutant population; generating a child population based on a comparison between each member of the generated trial population with a corresponding member of the parent population; and upon determining that a predetermined stopping criterion is not satisfied by the generated child population, repeating the evaluating, the selecting, the generating of the mutant population, the generating of the trial population, and the generating of the child population over a number of iterations until the predetermined stopping criterion is determined to be satisfied. The optimal set of anisotropy parameters may be selected from different anisotropy parameter sets within the child population upon determining that the predetermined stopping criterion is satisfied.

In one or more further embodiments of the present disclosure, a system may include at least one processor and a memory coupled to the processor that has instructions stored therein, which when executed by the processor, cause the processor to perform functions, including functions to: generate an initial three-dimensional (3D) model of layers in a subsurface formation; obtain travel time data for a plurality of seismic source and receiver locations associated with a vertical seismic profile (VSP) survey of the subsurface formation; simulate seismic wave propagation through each layer of the initial 3D model to select particular combinations of seismic source and receiver locations from the plurality of seismic source and receiver locations associated with the VSP survey, based on the travel time data; perform a global inversion of data points selected from the obtained travel time data to estimate different sets of anisotropy parameters for the layers of the initial 3D model, based on the simulation, the selected data points corresponding to the selected combinations of seismic source and receiver locations; refine the initial 3D model with an optimal set of anisotropy parameters selected from the different sets of anisotropy parameters estimated for the layers of the initial 3D model by the global inversion; and provide the refined 3D model for seismic analysis and well planning operations to be performed for the subsurface formation.

The functions performed by the processor may also include functions to: obtain formation data related to one or more layers of the subsurface formation from at least one data source; generate the initial 3D model of the one or more layers based on the corresponding formation data obtained from the data source; determine anisotropy parameters for each layer of the generated initial 3D model, based on the obtained formation data; simulate ray propagations between different seismic sources in the plurality of seismic sources located at the surface and different seismic receivers in the array of seismic receivers located within the borehole, based on the initial 3D model and the plurality of seismic source and receiver locations associated with the obtained travel time data; identify source and receiver combinations from the plurality of seismic source and receiver locations for which the simulated ray propagations from the seismic sources do not connect the corresponding seismic receivers; select the particular combinations of seismic source and receiver locations so as to filter out the identified source and receiver combinations from the plurality of seismic source and receiver locations; generate a parent population of different sets of anisotropy parameters based on predefined parameter search space boundaries; evaluate each set of anisotropy parameters in the generated parent population, based on an error value calculated for that set of anisotropy parameters; select an optimal set of anisotropy parameters from the parent population, based on the evaluation; generate a mutant population of mutant parameter sets based on the optimal set of anisotropy parameters selected from the parent population; generate a trial population based on a crossover between the parent population and the generated mutant population; generate a child population based on a comparison between each member of the generated trial population with a corresponding member of the parent population; determine whether or not a predetermined stopping criterion is not satisfied by the generated child population; repeat the evaluation, the selection of the optimal set, the generation of the mutant population, the generation of the trial population, and the generation of the child population over a number of iterations, when the predetermined stopping criterion is determined not to be satisfied and until the predetermined stopping criterion is determined to be satisfied; receive input to initiate the VSP survey of the subsurface formation; send one or more commands via a communication network to a VSP survey system to actuate a plurality of seismic sources for conducting the VSP survey in response to the received input from the user; and receive, from the VSP survey system via the communication network, the travel time data resulting from the conducted VSP survey.

For the foregoing embodiments of the system, the data source may be a surface seismic survey of the subsurface formation, and the obtained formation data may be a surface seismic depth image generated based on the surface seismic survey. The travel time data may include first arrival times of seismic wave propagations between a plurality of seismic sources located in a multi-azimuthal arrangement at a surface of a borehole drilled into the one or more layers of the subsurface formation and an array of seismic receivers located within the borehole. The simulation may be performed using anisotropic ray tracing (ART). The optimal set of anisotropy parameters may be selected from different anisotropy parameter sets within the child population when the predetermined stopping criterion is determined to be satisfied.

While specific details about the above embodiments have been described, the above hardware and software descriptions are intended merely as example embodiments and are not intended to limit the structure or implementation of the disclosed embodiments. For instance, although many other internal components of the system 1400 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed.

The description of the present disclosure has been presented for purposes of illustration and description, but is not intended to be exhaustive or limited to the embodiments in the form disclosed. Moreover, the above specific example embodiments are not intended to limit the scope of the claims. The example embodiments may be modified in any number of ways by including, excluding, or combining one or more features or functions described in the disclosure. Such modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modifications.

What is claimed is:

1. A computer-implemented method of estimating orthorhombic anisotropy parameters of subsurface rock layers, the method comprising:

generating an initial three-dimensional (3D) model of one or more layers in a subsurface formation;

obtaining travel time data for a plurality of seismic source and receiver locations associated with a vertical seismic profile (VSP) survey of the subsurface formation;

simulating seismic wave propagation through each layer of the initial 3D model using anisotropic ray tracing with different combinations of the seismic source and receiver locations associated with the VSP survey of the subsurface formation, based on the obtained travel time data;

selecting particular combinations of seismic source and receiver locations from the plurality of seismic source and receiver locations associated with the VSP survey, based on the simulation, wherein the selected combinations include only those seismic source and receiver locations for which the simulation produces a ray path connecting each seismic source location to a corresponding receiver location;

performing a global inversion of data points from the obtained travel time data corresponding to the selected combinations of seismic source and receiver locations in order to estimate a set of anisotropy parameters for the layers of the initial 3D model;

refining the initial 3D model using the set of anisotropy parameters estimated for the layers of the initial 3D model; and generating a seismic image of the one or more layers of the subsurface formation, based on the refined 3D model, wherein the generated seismic image is used for seismic analysis and well planning operations to be performed within the one or more layers of the subsurface formation.

2. The method of claim 1, wherein generating comprises:

obtaining formation data related to the one or more layers of the subsurface formation from at least one data source;

generating the initial 3D model of the one or more layers based on the corresponding formation data obtained from the data source; and determining anisotropy parameters for each layer of the generated initial 3D model, based on the obtained formation data.

3. The method of claim 2, wherein the data source is a surface seismic survey of the subsurface formation, and the obtained formation data is a surface seismic depth image generated based on the surface seismic survey.

4. The method of claim 2, wherein the travel time data includes first arrival times of seismic wave propagations between a plurality of seismic sources located in a multi-azimuthal arrangement at a surface of a borehole drilled into the one or more layers of the subsurface formation and an array of seismic receivers located within the borehole.

5. The method of claim 4, wherein simulating comprises:

simulating ray propagations between different seismic sources in the plurality of seismic sources located at the surface and different seismic receivers in the array of seismic receivers located within the borehole, based on the initial 3D model and the plurality of seismic source and receiver locations associated with the obtained travel time data; and identifying, based on the simulated ray propagations, at least one seismic source and receiver combination from the plurality of seismic source and receiver locations for which no ray path connects the seismic source to the seismic receiver, and wherein selecting comprises:

selecting the particular combinations of seismic source and receiver locations so as to filter out the at least one source and receiver combination identified from the plurality of seismic source and receiver locations.

6. The method of claim 1, wherein performing the global inversion comprises:

generating a parent population of different sets of anisotropy parameters based on predefined parameter search space boundaries;

evaluating each set of anisotropy parameters in the generated parent population, based on an error value calculated for that set of anisotropy parameters;

selecting an optimal set of anisotropy parameters from the parent population, based on the evaluation;

generating a mutant population of mutant parameter sets based on the optimal set of anisotropy parameters selected from the parent population;

generating a trial population based on a crossover between the parent population and the generated mutant population;

generating a child population based on a comparison between each member of the generated trial population with a corresponding member of the parent population; and upon determining that a predetermined stopping criterion is not satisfied by the generated child population, repeating the evaluating, the selecting, the generating of the mutant population, the generating of the trial population, and the generating of the child population over a number of iterations until the predetermined stopping criterion is determined to be satisfied.

7. The method of claim 6, wherein the optimal set of anisotropy parameters is selected from different anisotropy parameter sets within the child population upon determining that the predetermined stopping criterion is satisfied.

8. The method of claim 6, wherein the predetermined stopping criterion is at least one of a predetermined number of iterations or an objective function error value associated with members of the respective parent and trial populations.

9. A system comprising:

at least one processor; and a memory coupled to the processor having instructions stored therein, which when executed by the processor, cause the processor to perform functions, including functions to:

generate an initial three-dimensional (3D) model of one or more layers in a subsurface formation;

obtain travel time data for a plurality of seismic source and receiver locations associated with a vertical seismic profile (VSP) survey of the subsurface formation;

simulate seismic wave propagation through each layer of the initial 3D model using anisotropic ray tracing with different combinations of the seismic source and receiver locations associated with the VSP survey of the subsurface formation, based on the travel time data;

select particular combinations of seismic source and receiver locations from the plurality of seismic source and receiver locations associated with the VSP survey, based on the simulation, wherein the selected combinations include only those seismic source and receiver locations for which the simulation produces a ray path connecting each seismic source location to a corresponding receiver location;

analysis and well planning operations to be performed within the one or more layers of the subsurface formation.

10. The system of claim 9, wherein the functions performed by the processor include functions to:

obtain formation data related to the one or more layers of the subsurface formation from at least one data source;

generate the initial 3D model of the one or more layers based on the corresponding formation data obtained from the data source; and determine anisotropy parameters for each layer of the generated initial 3D model, based on the obtained formation data.

11. The system of claim 10, wherein the data source is a surface seismic survey of the subsurface formation, and the obtained formation data is a surface seismic depth image generated based on the surface seismic survey.

12. The system of claim 10, wherein the travel time data includes first arrival times of seismic wave propagations between a plurality of seismic sources located in a multi-azimuthal arrangement at a surface of a borehole drilled into the one or more layers of the subsurface formation and an array of seismic receivers located within the borehole.

13. The system of claim 12, wherein the functions performed by the processor include functions to:

simulate ray propagations between different seismic sources in the plurality of seismic sources located at the surface and different seismic receivers in the array of seismic receivers located within the borehole, based on the initial 3D model and the plurality of seismic source and receiver locations associated with the obtained travel time data;

identify, based on the simulated ray propagations, at least one seismic source and receiver combination from the plurality of seismic source and receiver locations for which no ray path connects the seismic source to the seismic receiver; and select the particular combinations of seismic source and receiver locations so as to filter out the at least one source and receiver combination identified from the plurality of seismic source and receiver locations.

14. The system of claim 9, wherein the functions performed by the processor include functions to:

generate a parent population of different sets of anisotropy parameters based on predefined parameter search space boundaries;

evaluate each set of anisotropy parameters in the generated parent population, based on an error value calculated for that set of anisotropy parameters;

select an optimal set of anisotropy parameters from the parent population, based on the evaluation;

generate a mutant population of mutant parameter sets based on the optimal set of anisotropy parameters selected from the parent population;

generate a trial population based on a crossover between the parent population and the generated mutant population;

generate a child population based on a comparison between each member of the generated trial population with a corresponding member of the parent population;

determine whether or not a predetermined stopping criterion is satisfied by the generated child population; and repeat the evaluation, the selection of the optimal set, the generation of the mutant population, the generation of the trial population, and the generation of the child population over a number of iterations, when the predetermined stopping criterion is determined not to be satisfied and until the predetermined stopping criterion is determined to be satisfied.

15. The system of claim 14, wherein the optimal set of anisotropy parameters is selected from different anisotropy parameter sets within the child population when the predetermined stopping criterion is determined to be satisfied.

16. The method of claim 14, wherein the predetermined stopping criterion is at least one of a predetermined number of iterations or an objective function error value associated with members of the respective parent and trial populations.

17. The system of claim 9, wherein the functions performed by the processor further include functions to:

receive input to initiate the VSP survey of the subsurface formation;

send one or more commands via a communication network to a VSP survey system to actuate a plurality of seismic sources for conducting the VSP survey in response to the received input from the user; and receive, from the VSP survey system via the communication network, the travel time data resulting from the conducted VSP survey.

18. A computer-readable storage medium having instructions stored therein, which when executed by a computer cause the computer to perform a plurality of functions, including functions to:

generate an initial three-dimensional (3D) model of one or more layers in a subsurface formation;

obtain travel time data for a plurality of seismic source and receiver locations associated with a vertical seismic profile (VSP) survey of the subsurface formation;

simulate seismic wave propagation through each layer of the initial 3D model using anisotropic ray tracing with different combinations of the seismic source and receiver locations associated with the VSP survey of the subsurface formation, based on the travel time data;

select particular combinations of seismic source and receiver locations from the plurality of seismic source and receiver locations associated with the VSP survey, based on the simulation, wherein the selected combinations include only those seismic source and receiver locations for which the simulation produces a ray path connecting each seismic source location to a corresponding receiver location;

perform a global inversion of data points from the obtained travel time data corresponding to the selected combinations of seismic source and receiver locations in order to estimate a set of anisotropy parameters for the layers of the initial 3D model;

refine the initial 3D model using the set of anisotropy parameters estimated for the layers of the initial 3D model; and generate a seismic image of the one or more layers of the subsurface formation, based on the refined 3D model, wherein the generated seismic image is used for seismic analysis and well planning operations to be performed within the one or more layers of the subsurface formation.

19. The computer-readable storage medium of claim 18, wherein the plurality of functions performed by the computer include functions to:
obtain formation data related to the one or more layers of the subsurface formation from at least one data source;
generate the initial 3D model of the one or more layers based on the corresponding formation data obtained from the data source; and
determine anisotropy parameters for each layer of the generated initial 3D model, based on the obtained formation data.

20. The computer-readable storage medium of claim 18, wherein the plurality of functions performed by the computer include functions to:
simulate ray propagations between different seismic sources in the plurality of seismic sources located at the surface and different seismic receivers in the array of seismic receivers located within the borehole, based on the initial 3D model and the obtained travel time data;
identify, based on the simulated ray propagations, at least one seismic source and receiver combination from the plurality of seismic source and receiver locations for which no ray path connects the seismic source to the seismic receiver; and
select the particular combinations of seismic source and receiver locations so as to filter out the at least one source and receiver combination identified from the plurality of seismic source and receiver locations.

21. The computer-readable storage medium of claim 18, wherein the plurality of functions performed by the computer include functions to:
generate a parent population of different sets of anisotropy parameters based on predefined parameter search space boundaries;
evaluate each set of anisotropy parameters in the generated parent population, based on an error value calculated for that set of anisotropy parameters;
select an optimal set of anisotropy parameters from the parent population, based on the evaluation;
generate a mutant population of mutant parameter sets based on the optimal set of anisotropy parameters selected from the parent population;
generate a trial population based on a crossover between the parent population and the generated mutant population;
generate a child population based on a comparison between each member of the generated trial population with a corresponding member of the parent population;
determine whether or not a predetermined stopping criterion is satisfied by the generated child population;
repeat the evaluation, the selection of the optimal set, the generation of the mutant population, the generation of the trial population, and the generation of the child population over a number of iterations, when the predetermined stopping criterion is determined not to be satisfied and until the predetermined stopping criterion is determined to be satisfied; and
select the optimal set of anisotropy parameters from different anisotropy parameter sets within the child population when the predetermined stopping criterion is determined to be satisfied.

* * * * *